US009312507B2

(12) United States Patent
Tsutsui et al.

(10) Patent No.: US 9,312,507 B2
(45) Date of Patent: Apr. 12, 2016

(54) ORGANIC SEMICONDUCTOR ELEMENT

(75) Inventors: Tetsuo Tsutsui, Fukuoka (JP); Hiroko Yamazaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 392 days.

(21) Appl. No.: 13/150,564

(22) Filed: Jun. 1, 2011

(65) Prior Publication Data

US 2011/0227119 A1    Sep. 22, 2011

Related U.S. Application Data

(63) Continuation of application No. 12/195,537, filed on Aug. 21, 2008, now Pat. No. 7,956,353, which is a continuation of application No. 11/061,500, filed on Feb. 18, 2005, now Pat. No. 7,420,203, which is a continuation of application No. 10/309,843, filed on Dec. 4, 2002, now Pat. No. 7,956,349.

(30) Foreign Application Priority Data

Dec. 5, 2001   (JP) ................................ 2001-370980

(51) Int. Cl.
*H01L 51/50* (2006.01)
*B82Y 10/00* (2011.01)
(Continued)

(52) U.S. Cl.
CPC ............ *H01L 51/5052* (2013.01); *B82Y 10/00* (2013.01); *H01L 27/302* (2013.01); *H01L 51/424* (2013.01); *H01L 51/4246* (2013.01); *H01L 51/5278* (2013.01); *H01L 27/3209* (2013.01); *H01L 51/005* (2013.01);
(Continued)

(58) Field of Classification Search
None
See application file for complete search history.

(56) References Cited

U.S. PATENT DOCUMENTS 4,255,211 A    3/1981  Fraas
4,292,461 A    9/1981  Hovel
(Continued)

FOREIGN PATENT DOCUMENTS

CN    1236289 A    11/1999
CN    1289525 A    3/2001
(Continued)

OTHER PUBLICATIONS

Chemguide, "Amines as Bases", http://www.chemguide.co.uk/organicprops/amines/base.html, Jim Clark, 2004.*
(Continued)

*Primary Examiner* — Whitney T Moore
*Assistant Examiner* — Scott R Wilson
(74) *Attorney, Agent, or Firm* — Husch Blackwell LLP

(57) ABSTRACT

By introducing new concepts into a structure of a conventional organic semiconductor element and without using a conventional ultra thin film, an organic semiconductor element is provided which is more reliable and has higher yield. Further, efficiency is improved particularly in a photoelectronic device using an organic semiconductor. Between an anode and a cathode, there is provided an organic structure including alternately laminated organic thin film layer (functional organic thin film layer) realizing various functions by making an SCLC flow, and a conductive thin film layer (ohmic conductive thin film layer) imbued with a dark conductivity by doping it with an acceptor and a donor, or by the like method.

14 Claims, 9 Drawing Sheets

(51) Int. Cl.
  *H01L 27/30* (2006.01)
  *H01L 51/42* (2006.01)
  *H01L 51/52* (2006.01)
  *H01L 27/32* (2006.01)
  *H01L 51/00* (2006.01)
  *H01L 51/05* (2006.01)

(52) U.S. Cl.
  CPC .......... *H01L 51/007* (2013.01); *H01L 51/0051* (2013.01); *H01L 51/0052* (2013.01); *H01L 51/0053* (2013.01); *H01L 51/0059* (2013.01); *H01L 51/0062* (2013.01); *H01L 51/0077* (2013.01); *H01L 51/0078* (2013.01); *H01L 51/0081* (2013.01); *H01L 51/0595* (2013.01); *H01L 51/5012* (2013.01); *H01L 51/5036* (2013.01); *Y02E 10/50* (2013.01); *Y02E 10/549* (2013.01); *Y02P 70/521* (2015.11)

(56) References Cited

U.S. PATENT DOCUMENTS

| | | | |
|---|---|---|---|
| 4,552,927 A | 11/1985 | Warren | |
| 4,741,976 A | 5/1988 | Eguchi et al. | |
| 4,871,236 A | 10/1989 | Gemma et al. | |
| 4,913,744 A | 4/1990 | Hoegl et al. | |
| 4,971,919 A | 11/1990 | Yamazaki | |
| 5,093,698 A | 3/1992 | Egusa | |
| 5,294,870 A | 3/1994 | Tang et al. | |
| 5,364,654 A | 11/1994 | Hosokawa et al. | |
| 5,454,880 A | 10/1995 | Sariciftci et al. | |
| 5,458,977 A | 10/1995 | Hosokawa et al. | |
| 5,478,777 A | 12/1995 | Yamazaki | |
| 5,536,588 A | 7/1996 | Naito | |
| 5,648,181 A | 7/1997 | Watanabe | |
| 5,677,546 A | 10/1997 | Yu | |
| 5,682,043 A | 10/1997 | Pei et al. | |
| 5,684,320 A | 11/1997 | Kawashima | |
| 5,756,224 A | 5/1998 | Börner et al. | |
| 5,757,139 A | 5/1998 | Forrest et al. | |
| 5,821,690 A | 10/1998 | Martens et al. | |
| 5,837,391 A | 11/1998 | Utsugi | |
| 5,858,561 A | 1/1999 | Epstein et al. | |
| 5,917,280 A | 6/1999 | Burrows et al. | |
| 5,940,272 A | 8/1999 | Emori et al. | |
| 5,965,063 A | 10/1999 | Agata et al. | |
| 5,970,318 A | 10/1999 | Choi et al. | |
| 5,982,345 A | 11/1999 | Takayama et al. | |
| 6,013,384 A | 1/2000 | Kido et al. | |
| 6,107,734 A * | 8/2000 | Tanaka et al. | 313/506 |
| 6,188,175 B1 | 2/2001 | May et al. | |
| 6,198,091 B1 | 3/2001 | Forrest et al. | |
| 6,198,092 B1 | 3/2001 | Bulovic et al. | |
| 6,249,085 B1 | 6/2001 | Arai | |
| 6,255,774 B1 | 7/2001 | Pichler | |
| 6,278,055 B1 | 8/2001 | Forrest et al. | |
| 6,297,495 B1 | 10/2001 | Bulovic et al. | |
| 6,300,612 B1 | 10/2001 | Yu | |
| 6,329,085 B1 | 12/2001 | Burrows et al. | |
| 6,337,492 B1 | 1/2002 | Jones et al. | |
| 6,340,789 B1 | 1/2002 | Petritsch et al. | |
| 6,344,660 B1 | 2/2002 | Imitrakopoulos et al. | |
| 6,352,777 B1 | 3/2002 | Bulovic et al. | |
| 6,383,898 B1 | 5/2002 | Kishimoto | |
| 6,403,392 B1 | 6/2002 | Burrows et al. | |
| 6,404,126 B1 | 6/2002 | Arai et al. | |
| 6,414,432 B1 | 7/2002 | Hieda et al. | |
| 6,423,429 B2 | 7/2002 | Kido et al. | |
| 6,451,415 B1 | 9/2002 | Forrest et al. | |
| 6,452,092 B2 | 9/2002 | Han et al. | |
| 6,483,123 B1 | 11/2002 | Kim et al. | |
| 6,486,601 B1 | 11/2002 | Sakai et al. | |
| 6,524,884 B1 | 2/2003 | Kim et al. | |
| 6,551,723 B1 | 4/2003 | Okada et al. | |
| 6,559,375 B1 | 5/2003 | Meissner et al. | |
| 6,566,806 B1 | 5/2003 | Kawai | |
| 6,566,807 B1 * | 5/2003 | Fujita et al. | 313/506 |
| 6,580,027 B2 | 6/2003 | Forrest et al. | |
| 6,580,213 B2 | 6/2003 | Yamazaki | |
| 6,589,673 B1 | 7/2003 | Kido et al. | |
| 6,614,176 B2 | 9/2003 | Kim et al. | |
| 6,632,545 B1 * | 10/2003 | Kido et al. | 428/690 |
| 6,651,871 B2 | 11/2003 | Ogure | |
| 6,657,378 B2 | 12/2003 | Forrest et al. | |
| 6,692,820 B2 | 2/2004 | Forrest et al. | |
| 6,713,192 B2 | 3/2004 | Fukuoka et al. | |
| 6,717,358 B1 | 4/2004 | Liao et al. | |
| 6,794,675 B1 | 9/2004 | Suzuki et al. | |
| 6,812,399 B2 | 11/2004 | Shaheen et al. | |
| 6,844,025 B2 | 1/2005 | Forrest et al. | |
| 6,872,472 B2 | 3/2005 | Liao et al. | |
| 6,876,007 B2 | 4/2005 | Yamazaki et al. | |
| 6,914,272 B2 | 7/2005 | Goetz et al. | |
| 6,936,846 B2 | 8/2005 | Koyama et al. | |
| 7,026,041 B2 | 4/2006 | Forrest et al. | |
| 7,142,781 B2 | 11/2006 | Koyama et al. | |
| 7,151,217 B2 | 12/2006 | Forrest et al. | |
| 7,199,521 B2 | 4/2007 | Ibe | |
| 7,205,585 B2 | 4/2007 | Forrest et al. | |
| 7,239,081 B2 | 7/2007 | Tsutsui | |
| 7,291,969 B2 | 11/2007 | Tsutsui | |
| 7,420,203 B2 | 9/2008 | Tsutsui et al. | |
| 7,473,923 B2 | 1/2009 | Tsutsui et al. | |
| 7,531,847 B2 | 5/2009 | Shitagaki et al. | |
| 8,519,258 B2 | 8/2013 | Forrest et al. | |
| 2001/0031509 A1 | 10/2001 | Yamazaki | |
| 2001/0046611 A1 | 11/2001 | Kido et al. | |
| 2002/0021088 A1 * | 2/2002 | Howard et al. | 313/504 |
| 2002/0021266 A1 | 2/2002 | Koyama et al. | |
| 2002/0027416 A1 | 3/2002 | Kim et al. | |
| 2002/0028347 A1 | 3/2002 | Marrocco, III et al. | |
| 2002/0074935 A1 | 6/2002 | Kwong et al. | |
| 2002/0119297 A1 | 8/2002 | Forrest et al. | |
| 2002/0173068 A1 | 11/2002 | Kido et al. | |
| 2002/0180349 A1 | 12/2002 | Aziz et al. | |
| 2002/0182441 A1 * | 12/2002 | Lamansky et al. | 428/690 |
| 2002/0189666 A1 | 12/2002 | Forrest et al. | |
| 2002/0197462 A1 | 12/2002 | Forrest et al. | |
| 2003/0042846 A1 | 3/2003 | Forrest et al. | |
| 2003/0094612 A1 | 5/2003 | Yamazaki et al. | |
| 2003/0148871 A1 * | 8/2003 | Inoue | 501/134 |
| 2003/0159729 A1 | 8/2003 | Shaheen et al. | |
| 2003/0170491 A1 | 9/2003 | Liao et al. | |
| 2003/0209974 A1 | 11/2003 | Yamazaki | |
| 2003/0218166 A1 | 11/2003 | Tsutsui | |
| 2004/0027059 A1 | 2/2004 | Tsutsui | |
| 2004/0027061 A1 | 2/2004 | Seo et al. | |
| 2004/0113546 A1 | 6/2004 | Forrest et al. | |
| 2004/0123804 A1 | 7/2004 | Yamazaki et al. | |
| 2004/0124505 A1 | 7/2004 | Mahle et al. | |
| 2004/0139914 A1 | 7/2004 | Yamazaki et al. | |
| 2004/0150333 A1 | 8/2004 | Tsutsui | |
| 2004/0151887 A1 | 8/2004 | Forrest et al. | |
| 2004/0245541 A1 | 12/2004 | Shitagaki et al. | |
| 2005/0012456 A1 | 1/2005 | Nakatsu et al. | |
| 2005/0023522 A1 | 2/2005 | Frey et al. | |
| 2005/0029933 A1 | 2/2005 | Liao et al. | |
| 2005/0051774 A1 | 3/2005 | Koyama | |
| 2005/0123751 A1 | 6/2005 | Tsutsui et al. | |
| 2005/0133783 A1 | 6/2005 | Yamazaki et al. | |
| 2005/0134173 A1 | 6/2005 | Tsutsui et al. | |
| 2005/0156197 A1 | 7/2005 | Tsutsui et al. | |
| 2006/0091797 A1 | 5/2006 | Tsutsui et al. | |
| 2007/0007538 A1 | 1/2007 | Ono et al. | |
| 2008/0176098 A1 | 7/2008 | Forrest et al. | |
| 2010/0307555 A1 | 12/2010 | Forrest et al. | |

FOREIGN PATENT DOCUMENTS

| | | |
|---|---|---|
| CN | 1297671 A | 5/2001 |
| DE | 19854938 A1 | 6/2000 |
| EP | 0 042 467 A2 | 12/1981 |
| EP | 0 215 683 | 3/1987 |
| EP | 0 461 542 A2 | 12/1991 |

(56) References Cited

FOREIGN PATENT DOCUMENTS

| | | |
|---|---|---|
| EP | 0 855 848 A2 | 7/1998 |
| EP | 0 948 063 A2 | 10/1999 |
| EP | 1 017 118 A2 | 7/2000 |
| EP | 1 056 139 A2 | 11/2000 |
| EP | 1 061 778 A1 | 12/2000 |
| EP | 1 089 361 A2 | 4/2001 |
| EP | 1 117 277 A1 | 7/2001 |
| EP | 1 148 553 A2 | 10/2001 |
| EP | 1 191 822 A1 | 3/2002 |
| EP | 1 315 208 A2 | 5/2003 |
| EP | 1 318 553 A2 | 6/2003 |
| EP | 1 339 112 A2 | 8/2003 |
| EP | 1 388 903 A2 | 2/2004 |
| EP | 1 388 904 A2 | 2/2004 |
| EP | 1 408 563 A2 | 4/2004 |
| EP | 2 287 922 A1 | 2/2011 |
| EP | 2 295 238 A1 | 3/2011 |
| EP | 2 298 547 A1 | 3/2011 |
| EP | 2 312 648 A1 | 4/2011 |
| EP | 2 317 567 A1 | 5/2011 |
| EP | 2 400 554 A1 | 12/2011 |
| GB | 2 347 017 A | 8/2000 |
| JP | 55-140277 | 11/1980 |
| JP | 57-13778 | 1/1982 |
| JP | 57-050481 A | 3/1982 |
| JP | 57-124481 A | 8/1982 |
| JP | 60-28278 | 2/1985 |
| JP | 63-6882 | 1/1988 |
| JP | 3-272186 | 12/1991 |
| JP | 4-49665 A | 2/1992 |
| JP | 4-192374 | 7/1992 |
| JP | 4-192376 | 7/1992 |
| JP | 5-121770 | 5/1993 |
| JP | 6-120535 | 4/1994 |
| JP | 6-122277 | 5/1994 |
| JP | 6-176870 | 6/1994 |
| JP | 6-176870 A | 6/1994 |
| JP | 6-188074 A | 7/1994 |
| JP | 6-318725 | 11/1994 |
| JP | 10-199678 A | 7/1998 |
| JP | 10-270171 | 10/1998 |
| JP | 11-15408 A | 1/1999 |
| JP | 11-250171 | 9/1999 |
| JP | 11-251067 | 9/1999 |
| JP | 11-283750 | 10/1999 |
| JP | 11-329748 | 11/1999 |
| JP | 11-329749 | 11/1999 |
| JP | 2000-52591 | 2/2000 |
| JP | 2000-63818 | 2/2000 |
| JP | 2000-243563 | 9/2000 |
| JP | 2000-260572 A | 9/2000 |
| JP | 2000-306676 | 11/2000 |
| JP | 2000-315581 | 11/2000 |
| JP | 2000-315581 A | 11/2000 |
| JP | 2000-340813 | 12/2000 |
| JP | 2000-348864 A | 12/2000 |
| JP | 2001-85718 | 3/2001 |
| JP | 2001-167808 | 6/2001 |
| JP | 2001-244074 | 9/2001 |
| JP | 2001-244079 | 9/2001 |
| JP | 2001-284050 A | 10/2001 |
| JP | 2001-291592 | 10/2001 |
| JP | 2001-313180 | 11/2001 |
| JP | 2001-357975 | 12/2001 |
| JP | 2002-33193 | 1/2002 |
| JP | 2002-94085 | 3/2002 |
| JP | 2002-164170 | 6/2002 |
| JP | 2002-531958 | 9/2002 |
| JP | 2002-319688 | 10/2002 |
| JP | 2003-45676 | 2/2003 |
| JP | 2003-515933 | 5/2003 |
| JP | 2004-39617 | 2/2004 |
| JP | 2004-111085 | 4/2004 |
| JP | 2004-281371 A | 10/2004 |
| KR | 1999-024361 | 4/1999 |
| KR | 2001-0014528 | 2/2001 |
| KR | 2001-0092905 | 10/2001 |
| KR | 2001-0098665 A | 11/2001 |
| KR | 10-0955897 | 5/2010 |
| WO | WO 95/06400 A1 | 3/1995 |
| WO | WO 99/03158 A1 | 1/1999 |
| WO | WO 99/39372 A2 | 8/1999 |
| WO | WO 99/49525 A1 | 9/1999 |
| WO | WO 00/01203 A1 | 1/2000 |
| WO | WO 00/11725 A1 | 3/2000 |
| WO | WO 00/33396 A1 | 6/2000 |
| WO | WO 01/39276 A1 | 5/2001 |
| WO | WO 01/84644 A1 | 11/2001 |
| WO | WO 02/101838 A1 | 12/2002 |
| WO | WO 2004/112440 A1 | 12/2004 |

OTHER PUBLICATIONS

Third party submission in the prosecution of counterpart KR application 10-2010-0021770, filed with the KR Patent Office on Mar. 22, 2011 (with English translation).
Office Action re Japanese Patent Application No. JP 2006-265113, dated Oct. 30, 2007 (with complete English translation—"Notification of Reasons for Refusal").
Memorandum and Order, *International Manufacturing and Engineering Services Co., v. Semiconductor Energy Laboratory Co., Ltd.*, Civil Action No. 06-1230 (JDB), US District Court, District of Columbia, dated Jan. 7, 2008.
Judgment—Request for Adverse—Bd. R. 127(b), filed May 2, 2008, pp. 1-2 for Interference No. 105,614.
Office Action re Chinese application No. CN 200510092078.1, dated Mar. 28, 2008 (with full English translation).
Guo, X. et al, "High Efficiency Tunneling-Regenerated Multi-Active Region Light Emitting Diodes," Optoelectronic Materials and Devices II, Proceedings of SPIE vol. 4078, 2000, pp. 170-179.
Declaration of Interference, for Patent Interference No. 105,614 (JL) dated Feb. 5, 2008.
Liao List of Motions, Patent Interference No. 105,614 (JL) dated Mar. 19, 2008.
Letter from Timothy J. Maier, Esq. to Mark J. Murphy, Esq., dated Nov. 17, 2010 (with attachment).
Third Party Submission Under Rule 114(2), against European application No. EP 02027513.7, submitted Dec. 9, 2010, and mailed Jan. 4, 2011.
Office Action re Korean application No. KR 2010-0021770, dated Jan. 17, 2011 (with English translation).
International Manufacturing and Engineering Services Company Ltd.'s Opposition to the Motion for Attorney's Fees and Costs, dated Sep. 27, 2007.
Semiconductor Energy Laboratory Company Ltd.'s Reply in Support of its Motion for Attorney's Fees and Costs, dated Oct. 9, 2007.
Order granting Motion to Dismiss by Semiconductor Energy Laboratory Co. and denying Motion to Stay by International Manufacturing and Engineering Services Company, Ltd. (Jul. 16, 2007).
Memorandum Opinion accompanying Order (Jul. 16, 2007).
Semiconductor Energy Laboratory Company, Ltd.'s Motion for Attorneys' Fees and Costs and Memorandum in Support Thereof (Jul. 30, 2007).
Xu, Y et al., "Photoresponsivity of Polymer Thin-Film Transistors based on Polyphenyleneethynylene Derivative with Improved Hole Injection,", Appl. Phys. Lett. (Applied Physics Letters), vol. 85, No. 18, Nov. 1, 2004, pp. 4219-4221.
Chen, C.H. et al., Recent Development in Molecular Organic Electroluminescent Materials, Macromol. Symp. (Macromolecular Symposia), vol. 125, 1997, pp. 1-48.
Appeal decision (appeal No. 2006-19105) in Japanese application No. JP 2004-360375, dated Feb. 13, 2007 (with English translation pp. 1-14).
"Pre-Notice Prior to Primary Decision" filed in Taiwanese patent application No. 94142349 (English translation pp. 1-9).
Complaint for Unfair Competition against Semiconductor Energy Laboratory Co., Ltd. filed by International Manufacturing and Engineering Services Company, Ltd.(Jul. 7, 2006).

(56) References Cited

OTHER PUBLICATIONS

Motion to Dismiss Plaintiff's Complaint filed by Semiconductor Energy Laboratory Co., Ltd. (Attachments: Exhibit A to Memorandum, Exhibit B to Memorandum, Exhibit C to Memorandum) (Oct. 13, 2006).
Motion for Stay and for Extension of Time to Oppose Defendant's Motion to Dismiss by International Manufacturing and Engineering Services Company, Ltd. (Attachment: Memorandum of Law in Support of Motion for Stay (Oct. 31, 2006).
Memorandum in Opposition to Plaintiff's Motion for Stay filed by Semiconductor Energy Laboratory Co., Ltd. (Nov. 13, 2006).
Amended Complaint Against Semiconductor Energy Laboratory Co., Ltd. filed by International Manufacturing and Engineering Services Company Ltd. (Dec. 15, 2006).
Memorandum in Opposition to Defendant's Motion to Dismiss Plaintiff's Complaint filed by International Manufacturing and Engineering Services Company, Ltd. (Dec. 15, 2006).
Plaintiff's Reply Memorandum in Support of Its Motion for STAY filed by International Manufacturing and Engineering Services, Ltd. (Attachments: Declaration of David A. Einhorn, Exhibit 1 to Einhorn Declaration ) (Dec. 15, 2006).
Reply Memorandum in Support of Its Motion to Dismiss Plaintiff's Complaint and Amended Complaint filed by Semiconductor Energy Laboratory Co., Ltd. (Dec. 29, 2006).
Motion for Leave to File Surreply Memorandum of Law in Further Opposition to Defendant's Motion to Dismiss the Plaintiff's Complaint by International Manufacturing and Engineering Services Company, Ltd. (Attachments: Plaintiff's Surreply Memorandum of Law in Further Opposition to Defendant's Motion to Dismiss Plaintiff's Complaint) (Jan. 11, 2007).
Semiconductor Energy Laboratory Company, Ltd.'s Motion for Leave to File Supplemental Reply Memorandum in Support of Its Motion to Dismiss Plaintiff's Complaint and Amended Complaint (Attachments: Semiconductor Energy Laboratory Company, Ltd.'s Supplemental Reply Memorandum in Support of Its Motion to Dismiss Plaintiff's Complaint and Amended Complaint) (Jan. 24, 2007).
Decision of refusal dated May 10, 2005, in Japanese patent application No. JP 2002-352488 (with English translation).
Interrogation dated Nov. 29, 2005, in Japanese patent application No. JP 2002-352488 (with English translation).
European Search Report re application No. EP 02027513.7, dated Feb. 15, 2006.
EPO Communication re application No. 02027513.7, dated Sep. 26, 2005.
"Generation of pair of electron and hole Condition of non-ohmic contact (Required voltage=2V+$\Delta$V)".
"Generation of pair of electron and hole Condition of ohmic contact (Required voltage=2V)".
"Experimental result for verifying whether the invention in embodiments 1 and 2 in European Patent Application No. 02027513.7 could be carried out or not," pp. 1-15 (with English translation).
Japanese Patent Office notification for Japanese patent application No. JP 2002-352488, dated May 30, 2005 (with English translation).
Experiment results confirming enablement of embodiments 1 & 2 of priority Japanese patent application No. JP 2002-352488, pp. 1-15.
Kido et al, Document submitted in Japanese patent application No. JP 2002-352488, pp. 1-17, dated Apr. 21, 2005 (with English translation).
Australian Patent Office search report re Singapore Patent Application No. SG 200207343-5, dated Sep. 7, 2004.
Fuchigami, H. et al, "Polythienylenevinylene Thin-Film Transistor with High Carrier Mobility," Applied Physics Letters, vol. 63, No. 10, Sep. 6, 1993, pp. 1372-1374.
Gundlach, D.J. et al, "Pentacene Organic Thin-Film Transistors—Molecular Ordering and Mobility," IEEE Electron Device Letters, vol. 18, No. 3, Mar. 1997, pp. 87-89.
Ruhstaller, B. et al, "Bias-Tuned Reduction of Self-Absorption in Polymer Blend Electroluminescence," Chemical Physics Letters, vol. 317, Feb. 4, 2000, pp. 238-244.
Narayan, K.S. et al, "Light Responsive Polymer Field-Effect Transistor," Applied Physics Letters, vol. 79, No. 12, Sep. 17, 2001, pp. 1891-1893.
Kido et al, "High Quantum Efficiency Organic EL Devices Having Charge Generation Layer," Extended Abstracts, The $49^{th}$ Spring Meeting of the Japan Society of Applied Physics and Related Societies, No. 3, Mar. 2002, p. 1308, 27p-YL-3; (with English translation).
Japanese Patent Office, Office Action re application No. JP 2002-352488, mailed Jan. 6, 2005; (with English translation).
Shirakwa, H. et al., "Synthesis of Electrically Conducting Organic Polymers: Halogen Derivatives of Polyacetyrene (CH)x," J.C.S. Chem. Comm. No. 16, 1977, pp. 578-580.
Tang, C.W. et al., "Two-Layer Organic Photovoltaic Cell," Applied Physics Letters, vol. 48, No. 2, Jan. 13, 1986, pp. 183-185.
Tang, C.W. et al., "Organic Electroluminescent Diodes," Applied Physics Letters, vol. 51, No. 12, Sep. 21, 1987, pp. 913-915.
Hiramoto, M. et al., "Effect of Thin Gold Interstitial-Layer on the Photovoltaic Properties of Tandem Organic Solar Cell," Chemistry Letters, 1990, pp. 327-330.
Tsutsui, T., "Mechanism of Organic EL Element and Luminous Efficiency," Concise Statement, *Textbook of the $3^{rd}$ Seminar at Division of Organic Molecular Electronics and Bioelectronics*, The Japan Society of Applied Physics, 1993, pp. 31-37 (with English abstract).
Parthasarathy, G. et al., "A Metal-Free Cathode for Organic Semiconductor Devices," Applied Physics Letters, vol. 72, No. 17, Apr. 27, 1998, pp. 2138-2140.
Sato, Y., "Problem for Implementation in View of Materials Development," Concise Statement, The Japan Society of Applied Physics/Organic Molecular Electronics and Bioelectronics, vol. 11, No. 1, 2000, pp. 86-99.
Ferraris, J. et al., "Electron Transfer in a New Highly Conducting Donor-Acceptor Complex," Journal of the American Chemical Society, vol. 95, No. 3, Feb. 7, 1973, pp. 948-949.
Author unknown, "State of 'Generation of a Pair of Electron-Hole' and 'Non-Ohmic Contact,'" undated (with English translation).
Author unknown, "State of 'Generation of a Pair of Electron-Hole' and 'Ohmic Contact,'" undated (with English translation).
Yu, G. et al., "Charge Separation and Photovoltaic Conversion Polymer Composites with Internal Donor/Acceptor Heterojunctions," J. Appl. Phys., vol. 78, No. 7, Oct. 1, 1995, pp. 4510-4515.
U.S. Appl. No. 10/763,101, filed Jan. 22, 2004, including specification, abstract, claims and drawings (all in Japanese).
Tsutsui, T., "The Operation Mechanism and the Light Emission Efficiency of the Organic EL Element," Concise Statement, *Textbook of the $3^{rd}$ Seminar at Division of Organic Molecular Electronics and Bioelectronics*, The Japan Society of Applied Physics, 1993, pp. 31-37 (with full English translation, pp. 1-11).
Document submitted in Japanese Patent Application No. JP 2002-352488 by J. Kido et al., dated Jan. 21, 2004 (with full English translation).
Document submitted in Japanese Patent Application No. JP 2002-352488 by J. Kido et al., dated Feb. 2, 2004 (with full English translation).
Document submitted in Japanese Patent Application No. JP 2002-352488 by J. Kido et al., dated Feb. 9, 2004 (with full English translation).
Japan Patent Office Notification for Japanese Patent Application No. JP 2002-352488, dated Feb. 25, 2004 (with full English translation).
Japan Patent Office Notification for Japanese Patent Application No. JP 2002-352488, dated Mar. 8, 2004 (with full English translation).
Japan Patent Office Notification for Japanese Patent Application No. JP 2002-352488, dated Mar. 15, 2004 (with full English translation).
Office Action re Chinese application No. CN 201010131492.X, dated Feb. 24, 2011 (with English translation).
Office Action re Japanese application No. JP 2008-097829, dated Mar. 1, 2011 (with English translation).
Office Action re Japanese application No. JP 2008-287362, dated Mar. 1, 2011 (with English translation).
Office Action re Korean application No. KR 2010-0021770, dated Nov. 21, 2011 (with English translation).

(56) References Cited

OTHER PUBLICATIONS

Hung, L.S. et al., "Enhanced Electron Injection in Organic Electroluminescence Devices Using an Al/LiF Electrode," Applied Physics Letters, vol. 70, No. 2, Jan. 13, 1997, pp. 152-154.
Japanese Office Action re application No. JP 2002-352488, Dated Jan. 6, 2005 (in Japanese).
International Search Report re application No. PCT/JP2004/000206, Dated Feb. 24, 2004 (in Japanese).
Written Opinion re application No. PCT/JP2004/000206, Dated Feb. 24, 2004 (with partial English translation).
International Search Report re application No. PCT/JP2004/012440, Dated Dec. 28, 2004 (in Japanese).
Written Opinion re application No. PCT/JP2004/012440, Dated Dec. 28, 2004 (with partial English translation).
International Search Report re application No. PCT/JP2004/012457, Dated Dec. 28, 2004 (in Japanese).
Written Opinion re application No. PCT/JP2004/012457, Dated Dec. 28, 2004 (with partial English translation).
Judgment—Merits—Bd.R. 127 in *Kido* v. *Tsutsui*, Interference No. 105,616, Dated May 26, 2009 (with full English translation).
Lide, D.R., editor-in-chief, *Handbook of Chemistry and Physics*, CRC Press, 80th ed., 1999, p. 2-19.
Schon, J.H. et al., "Ambipolar Pentacene Field-Effect Transistors and Inverters," Science, vol. 287, Feb. 11, 2000, pp. 1022-1023.
European Search Report re application No. EP 03016830.6, Dated Apr. 16, 2007.
*Webster's Third New International Dictionary*, Unabridged, Merriam-Webster, Inc., Springfield, MA, 1993, p. 2302 (definition of "Surround").
Merriam-Webster's Collegiate Dictionary, 10th Ed., Merriam-Webster Inc., Springfield, MA, 1999, pp. 605 and 1359.
Korean Office Action re application No. KR 2008-0015351, Dated Mar. 26, 2009 (with full English tra.
Courric, S. et al, "The Electromagnetic Properties of Poly(p-phenylene-vinylene) Derivatives," Polymer, vol. 39, No. 12, 1998, Elsevier Science Ltd., pp. 2399-2408.
Office Action re Korean application No. KR 10-2011-0051294, dated Oct. 30, 2013 (with English translation).
Office Action re Korean application No. KR 10-2012-0148801, dated Oct. 30, 2013 (with English translation).
Hiramoto, M. et al., "Three-Layered Organic Solar Cell with a Photoactive Interlayer of Codeposited Pigments," Applied Physics Letters, Mar. 11, 1991, vol. 58, No. 10, pp. 1062-1064.
Chinese Office Action re Application No. CN 201210031103.5, dated Jan. 6, 2014.

* cited by examiner light

ORGANIC SEMICONDUCTOR ELEMENT

This application is a continuation of U.S. application Ser. No. 12/195,537 filed on Aug. 21, 2008 now U.S. Pat. No. 7,956,353 which is a continuation of U.S. application Ser. No. 11/061,500 filed on Feb. 18, 2005 (now U.S. Pat. No. 7,420,203 issued Sep. 2, 2008) which is a continuation of U.S. application Ser. No. 10/309,843 filed on Dec. 4, 2002 now U.S. Pat. No. 7,956,349.

BACKGROUND OF THE INVENTION

1. Field of the Invention

The present invention relates to an electronic device employing an organic semiconductor. More particularly, it relates to a photoelectronic device such as a photoelectric conversion element and an EL element.

2. Description of the Related Art

Compared to inorganic compounds, organic compounds include more varied material systems, and through appropriate molecular design it is possible to synthesize organic materials having various functionalities. Further, the organic compound is characterized in that films and the like formed using the organic compound demonstrate great pliancy, and superior processability can also be achieved by polymerization. In light of these advantages, in recent years, attention has been given to photonics and electronics employing functional organic materials.

Photonic techniques which make use of photophysical qualities of organic compounds have already played an important role in contemporary industrial techniques. For example, photosensitive materials, such as a photoresist, have become indispensable in a photolithography technology used for fine processing of semiconductors. In addition, since the organic compounds themselves have properties of light absorption and concomitant light emission (fluorescence or phosphorescence), they have considerable applicability as light emitting materials such as laser pigments and the like.

On the other hand, since organic compounds do not have carriers themselves, they essentially have superior insulation properties. Therefore, in the field of electronics where the electrical properties of organic materials are utilized, the main conventional use of organic compounds is insulators, where organic compounds are used as insulating materials, protective materials and covering materials.

However, there are means for making massive amounts of electrical current flow in the organic materials which is essentially insulators, and they are starting to be put to practical use in the electronics field. The "means" discussed here can be broadly divided into two categories.

The first of these, represented by conductive polymers, is means in which a $\pi$-conjugate system organic compound is doped with an acceptor (electron acceptor) or a donor (electron donor) to give the $\pi$-conjugate system organic compound a carrier (Reference 1: Hideki Shirakawa, Edwin J. Louis, Alan G. MacDiarmid, Chwan K. Chiang, and Alan J. Heeger, "Synthesis of Electrically Conducting Organic Polymers Halogen Derivatives of Polyacetyrene, $(CH)_x$", Chem. Comm., 1977, 16, 578-580). By increasing the doping amount, the carrier will increase up to a certain area. Therefore, its dark conductivity will also increase together with this, so that significant electricity will be made to flow.

Since the amount of the electrical flow can reach the level of a normal semiconductor or more, a group of materials which exhibit this behavior can be referred to as organic semiconductors (or, in some cases, organic conductors).

This means of doping the acceptor/donor to improve the dark conductivity to make the electrical current flow in the organic material is already being applied in part of the electronics field. Examples thereof include a rechargeable storage battery using polyaniline or polyacene and an electric field condenser using polypyrrole.

The other means for making massive electrical current flow in the organic material uses an SCLC (Space Charge Limited Current). The SCLC is an electrical current which is made to flow by injecting a space charge from the outside and moving it, the current density of which is expressed by Child's Law, i.e., Formula 1, shown below. In the formula, J denotes a current density, $\epsilon$ denotes a relative dielectric constant, $\epsilon_0$ denotes a vacuum dielectric constant, $\mu$ denotes a carrier mobility, V denotes a voltage, and d denotes a distance (hereinafter, referred to as "thickness") between electrodes applied with the voltage V:

$$J = 9/8 \cdot \epsilon \epsilon_0 \mu \cdot V^2/d^3 \qquad \text{Formula 1}$$

Note that the SCLC is expressed by Formula 1 in which no carrier trap when the SCLC flows is assumed at all. The electric current limited by the carrier trap is referred to as a TCLC (Trap Charge Limited Current), and it is proportionate to a power of the voltage, but both the SCLC and the TCLC are currents that are subject to bulk limitations. Therefore, both the SCLC and the TCLC are dealt with in the same way hereinbelow.

Here, for comparison, Formula 2 is shown as a formula expressing the current density when an Ohm current flows according to Ohm's Law. $\sigma$ denotes a conductivity, and E denotes an electric field strength:

$$J = \sigma E = \sigma \cdot V/d \qquad \text{Formula 2}$$

In Formula 2, since the conductivity $\sigma$ is expressed as $\sigma = ne\mu$ (where n denotes a carrier density, and e denotes an electric charge), the carrier density is included in the factors governing the amount of the electrical current that flows. Therefore, in an organic material having a certain degree of carrier mobility, as long as the material's carrier density is not increased by doping as described above, the Ohm current will not flow in a material which normally does not have few carriers.

However, as is seen in Formula 1, the factors which determine the SCLC are the dielectric constant, the carrier mobility, the voltage, and the thickness. The carrier density is irrelevant. In other words, even in the case of an organic material insulator with no carrier, by making the thickness d sufficiently small, and by selecting a material with a significant carrier mobility $\mu$, it becomes possible to inject a carrier from the outside to make the current flow.

Even when this means is used, the current flow amount can reach the level of a normal semiconductor or more. Thus, an organic material with a great carrier mobility $\mu$, in other words, an organic material capable of latently transporting a carrier, can be called an "organic semiconductor".

Incidentally, even among organic semiconductor elements which use the SCLC as described above, organic electroluminescent elements (hereinafter, referred to as "organic EL elements") which use both the photonic and electrical qualities of functional organic material as photoelectronic devices, have particularly demonstrated remarkable advancement in recent years.

The most basic structure of the organic EL element was reported by W. Tang, et al. in 1987 (Reference 2: C. W. Tang and S. A. Vanslyke, "Organic electroluminescent diodes", Applied Physics Letters, Vol. 51, No. 12, 913-915 (1987)). The element reported in Reference 2 is a type of diode element in which electrodes sandwich an organic thin film having a total thickness of approximately 100 nm and being constituted by laminating a hole-transporting organic compound and an electron-transporting organic compound, and the element uses a light emitting material (fluorescent material) as the electron-transporting compound. By applying voltage to the element, light-emission can be achieved as from a light emitting diode.

The light-emission mechanism is considered to work as follows. That is, by applying the voltage to the organic thin film sandwiched by the electrodes, the hole and the electron injected from the electrodes are recombined inside the organic thin film to form an excited molecule (hereinafter, referred to as a "molecular exciton"), and light is emitted when this molecular exciton returns to its base state.

Note that, types of molecular excitons formed by the organic compound can include a singlet excited state and a triplet excited state, and the base state is normally the singlet state. Therefore, emitted light from the singlet excited state is referred to as fluorescent light, and the emitted light from the triplet excited state is referred to as phosphorescent light. The discussion in this specification covers cases of contribution to the emitted light from both of the excited states.

In the case of the organic EL element described above, the organic thin film is normally formed as a thin film having a thickness of about 100 to 200 nm. Further, since the organic EL element is a self-luminous element in which light is emitted from the organic thin film itself, there is no need for such a back light as used in a conventional liquid crystal display. Therefore, the organic EL element has a great advantage in that it can be manufactured to be extremely thin and lightweight.

Further, in the thin film having a thickness of about 100 to 200 nm, for example, the time from when the carrier is injected to when the recombination occurs is approximately several tens of nanoseconds, given the carrier mobility exhibited by the organic thin film. Even when the time required by for the process form the recombination of the carrier to the emission of the light, it is less than an order of microseconds before the light emission. Therefore, one characteristic of the organic thin film is that response time thereof is extremely fast.

Because of the above-mentioned properties of thinness and lightweightness, the quick response time, and the like, the organic EL element is receiving attention as a next generation flat panel display element. Further, since it is self-luminous and its visible range is broad, its visibility is relatively good and it is considered effective as an element used in display screens of portable devices.

Further, in addition to the organic EL element, an organic solar battery is another representative example of an organic semiconductor element using organic material (i.e., an organic semiconductor) capable of transporting carriers latently, which is to say having a certain degree of carrier mobility.

In short, the organic solar battery utilizes an opposite structure to the organic EL element. That is, its structure is similar to the most basic structure of the organic EL element, where the organic thin film having the two-layer structure is sandwiched by electrodes (Reference 3: C. W. Tang, "Two-layer organic photovoltaic cell", Applied Physics Letters, vol. 48, No. 2, 183-185 (1986)). A photoelectric current generated by causing light to be absorbed into the organic thin film is used to obtain an electromotive force. The electric current that flows at this time can be understood as follows: the carrier generated by the light flows due to the carrier mobility present in the organic material.

In this way, the organic material, which was considered as having no purpose in the electronics field other than its original purpose as an insulator, can be made to perform central functionalities in various electronic devices and photoelectronic devices by skillfully devising the organic semiconductor. Accordingly, research in organic semiconductors has become robust at present.

Description has been made above regarding two methods using the organic semiconductor as means for flowing the electric current to the organic material which is essentially an insulator. However, each of these two methods has a different problem.

First, in the case where the acceptor and the donor are doped to the organic semiconductor to increase the carrier densities, the conductivity is actually improved but the organic semiconductor itself loses its own physical properties (light absorption, phosphorescence, etc.) which it originally had. For example, when a phosphorescent-light emitting π-conjugate system polymer material is doped with the acceptor/donor, its conductivity increases but it stops emitting light. Therefore, in exchange for obtaining the functionality of conductivity, the other various functionalities which the organic material possesses are sacrificed.

Further, although there is an advantage in that various conductivities can be achieved by adjusting a doping amount of the acceptor or the donor, no matter how much acceptor and donor are doped to increase the carrier, it is difficult to constantly obtain a carrier density equivalent to a metal or of an inorganic compound that is equivalent to a metal (e.g., nitride titan or other such inorganic compound conductor). In other words, with respect to conductivity, it is extremely difficult to surpass an inorganic material, except for in several examples. Thus, the only remaining advantage is that the organic material is extremely workable and pliant.

On the other hand, in the case where the SCLC (hereinafter, SCLC includes a photoelectric current) is made to flow to the organic semiconductor, the physical properties that the organic semiconductor originally had are not lost. A representative example of such is none other than the organic EL element, in which the light emission from the fluorescent material (or phosphorescent material) is utilized even when the electric current is made to flow. The organic solar battery also utilizes the functionality of light absorption by the organic semiconductor.

However, as can be understood by looking at Formula 1, since the SCLC is inversely proportionate to the 3rd power of the thickness d, the SCLC can only be made to flow through a structure consisting of electrodes sandwiched to both surfaces of extremely thin films. More specifically, in light of the general carrier mobility of organic materials, the structure must be an ultra thin film of approximately 100 nm to 200 nm.

It is true, however, that by adopting the above-mentioned ultra thin film structure, a significant amount of SCLC can be made to flow at low voltage. One reason why the organic EL element such as the one discussed in Reference 2 is successful is because the thickness of its organic thin film is designed as a uniformly ultra thin film having a thickness of approximately 100 nm.

However, the fact that the thickness d must be made extremely thin actually becomes the biggest problem when the SCLC is made to flow. First, in the 100 nm thin film, it is easy for pinholes and other such defects to develop, and short circuits and other such problems occur due to these, causing a concern that yield may deteriorate. Further, not only does the mechanical strength of the thin film decline, but also the manufacturing process itself is restricted because the film must be an ultra thin film.

Further, when the SCLC is used as the electric current, the physical properties that the organic semiconductor itself originally possessed are not lost, and there is an advantage in that various functionalities can be produced. However, deterioration of the functionality of the organic semiconductor is accelerated by making the SCLC flow. For example, looking at the organic EL element as an example, it is known that the lifetime of the element (i.e., the half-life of the brightness level of the emitted light) deteriorates almost in inverse proportion to its original brightness, or, in other words, to the amount of electrical current that is made to flow (Reference 4: Yoshiharu SATO, "The Japan Society of Applied Physics/Organic Molecular Electronics and Bioelectronics", vol. 11, No. 1 (2000), 86-99).

As described above, in the device where the acceptor or the donor is doped to produce conductivity, functionalities other than the conductivity are lost. Further, in the device where the SCLC is used to produce the conductivity, the flowing of massive amounts of an electrical current through the ultra thin film becomes a cause of problems regarding the element's reliability and the like.

Incidentally, in photoelectronic devices using the organic semiconductors, such as organic EL elements and organic solar batteries, there is also a problem with respect to efficiency.

The organic EL element will be discussed as an example. The light emitting mechanism of the organic EL element is that the injected hole and electron recombine with each other to be converted into light. Therefore, theoretically, it is possible to extract at most one photon from the recombination of one hole and one electron, and it is not be possible to extract a plurality of photons. That is, the internal quantum efficiency (the number of emitted photons with respect injected carriers) should be at most 1.

However, in reality, it is difficult to bring the internal quantum efficiency close to 1. For example, in the case of the organic EL element using the fluorescent material as the light emitting body, the statistical ratio of generation for the singlet excited state (S*) and the triplet excited state (T*) is considered to be S*:T*=1:3 (Reference 5: Tetsuo TSUTSUI, "Textbook of the 3rd seminar at Division of Organic Molecular Electronics and Bioelectronics, The Japan Society of Applied Physics", p. 31 (1993)). Therefore, the theoretical limit of the internal quantum efficiency is 0.25. Furthermore, as long as the fluorescent quantum yield from the fluorescent material is not $\phi_f$, the internal quantum efficiency will drop even lower than 0.25.

In recent years, attempts have been made to use phosphorescent materials to use the light emission from the triplet excited state to bring the internal quantum efficiency's theoretical limit close to 0.75 to 1, and the efficiency actually surpassing that of fluorescent material has been achieved. However, in order to achieve this, it is necessary to use a phosphorescent material with a high phosphorescent quantum efficiency $\phi_p$. Therefore, the range of selection for the material is unavoidably restricted. This is because organic compounds that can emit phosphorescent light at room temperature are extremely rare.

In other words, if means could be structured for improving the electrical current efficiency (the brightness level generated in relation to the electrical current) of the organic EL element, this would be a great innovation. If the electrical current efficiency is improved, a greater level of brightness can be produced with a smaller electrical current. Conversely, since the electrical current can be reduced for achieving a certain brightness level, the deterioration caused by the massive amount of electrical current made to flow to the ultra thin film as described above can be reduced.

The inverse structure of the organic EL element, which is to say the photoelectric conversion such as in the organic solar battery, is inefficient at present. As described above, in the organic solar battery using the conventional organic semiconductor, the electrical current does not flow if the ultra thin film is not used. Therefore, electromotive force is not produced, either. However, when the ultra thin film is adopted, a problem arises in that the light absorption efficiency is poor (i.e., the light cannot be completely absorbed). This problem is considered to be the largest reason for the poor efficiency.

In light of the foregoing discussion, the electronic device using the organic semiconductor has a shortcoming in that when the massive electrical current is made to flow in a device utilizing the physical properties that are unique to the organic material, the reliability and yield from the device is influenced unfavorably. Furthermore, particularly in the photoelectronic device, the efficiency of the device is poor. These problems basically can be said to arise from the "ultra thin film" structure of the conventional organic semiconductor element.

SUMMARY OF THE INVENTION

Therefore, an object of the present invention is to introduce a new concept to the structure of the conventional organic semiconductor element, to provide an organic semiconductor element with not only greater reliability but also higher yield, without using the conventional ultra thin film. Another object of the present invention is to improve the efficiency of the photoelectronic device using the organic semiconductor.

The inventor of the present invention, as a result of repeated intense studies, has devised means capable of achieving the above-mentioned object by combining an organic semiconductor that is doped with an acceptor or a donor to make it conductive, and an organic semiconductor in which an SCLC is used to achieve the conductivity. The most basic structure thereof is shown in FIG. 1.

FIG. 1 shows an organic semiconductor element comprised of an organic structure in which, between an anode and a cathode, there are alternatively laminated an organic thin film layer (referred to as a "functional organic thin film layer" in the present specification) for realizing various functionalities by flowing an SCLC, and a conductive thin film layer in a floating state in which a dark conductivity is achieved by doping the acceptor or donor, or by another method.

What is important here, is that the conductive thin film layer should be connected substantially ohmically to the functional organic thin film layer (in this case, the conductive thin film layer is particularly referred to as an "ohmic conductive thin film layer"). In other words, obstructions between the conductive thin film layer and the functional organic thin film layer should be eliminated or extremely minimized.

By adopting the above structure, holes and electrons are easily injected each from the ohmic conductive thin film layers into each of the functional organic thin film layers. For example, a conceptual diagram of an element shown in FIG. 1 as n=2 is shown in FIGS. 2A and 2B. In FIGS. 2A and 2B, when an electrical voltage is applied between the anode and the cathode, electrons are easily injected from a first ohmic conductive thin film layer into a first functional organic thin film layer, and the holes are easily injected from the first ohmic conductive thin film layer into a second functional organic thin film layer. When viewed from an external circuit, a hole moves from the anode toward the cathode, and an electron moves from the cathode toward the anode (FIG. 2A). However, it can also be understood that both the electron and the hole flow from the ohmic conductive thin film layer back toward the opposite directions (FIG. 2B).

Here, by making each functional organic thin film layer to have a thickness of 100 nm to 200 nm or smaller, the carrier injected into each functional organic thin film layer can be made to flow as the SCLC. That is, in each functional organic thin film layer, a functionality (such as light emission or the like) derived from the inherent physicality of the organic material can be realized.

Moreover, when the basic structure of the present invention is applied, the organic structure can be made to have any degree of thickness, which is extremely useful. In other words, assume that in the conventional element (in which a functional organic thin film layer 303 is sandwiched between a cathode 301 and a anode 302), a given electrical voltage V is applied to the film thickness d to thereby obtain an electrical current density of J (FIG. 3A). Here, in the case of the present invention (FIG. 3B) with the alternatively laminated n number of functional organic thin film layers 303 similarly having film thickness d and (n−1) number of ohmic conductive thin film layers 304, where it was only possible to flow the SCLC into the thickness d (which was 100 nm to 200 nm in the conventional art), the present invention appears equivalent to flowing an SCLC having the current density J to a film thickness nd, just as in the case shown in FIG. 3A. In other words, the effect is that of FIG. 3C, but this is impossible in the conventional art because no matter how much voltage is applied, the SCLC suddenly stops flowing if the film thickness becomes very thick.

Of course, this simply means only that an electrical voltage nV is required. However, the electronic devices using the organic semiconductor can easily overcome the problem in that by utilizing the organic material's inherent physical properties, when a massive amount of electrical current is made to flow, there is a negative effect on the reliability and the yield of the device.

Thus, by providing the organic structure with the alternately laminated functional organic thin film layer and conductive thin film layer, the organic semiconductor element can make the SCLC flow in greater film thickness than in the conventional art. This concept did not exist until now. This concept can obviously be applied in organic EL elements where the SCLC is made to flow to achieve light emission and in organic solar batteries which utilize a photoelectric current and are said to have the opposite mechanism of the organic EL elements. The concept can also be applied broadly to other organic semiconductor elements.

Therefore, according to the present invention, there is provided an organic semiconductor element comprised of an organic structure formed by sequentially laminating an n number of functional organic thin film layers (where n is an integer equal to or greater than 2) consisting of a first through an n-th functional organic thin film layers between an anode and a cathode, characterized in that: a conductive thin film layer in a floating state is without exception formed between a k-th functional organic thin film layer (where k is an integer of 1≤k≤(n−1)) and a (k+1)th functional organic thin film layer; and each of the conductive thin film layers ohmically contacts with each of the functional organic thin film layer.

In this case, as the conductive thin film layer, it is preferable to use an organic compound instead of using a metal or a conductive inorganic compound. Particularly in the case of the photoelectronic device which requires transparency, it is preferable to use the organic compound.

Therefore, according to the present invention, there is provided an organic semiconductor element comprised of an organic structure formed by sequentially laminating an n number of functional organic thin film layers (where n is an integer equal to or greater than 2) consisting of a first through an n-th functional organic thin film layers between an anode and a cathode, characterized in that: a conductive thin film layer in a floating state which includes an organic compound is without exception fondled between a k-th functional organic thin film layer (where k is an integer of 1≤k≤(n−1)) and a (k+1)th functional organic thin film layer; and each of the conductive thin film layers ohmically contacts with each of the functional organic thin film layer.

Also, in order to contact the conductive thin film layer with the functional organic thin film layer ohmically or in a substantially equivalent manner, as described above, it is important to adopt the means in which the conductive thin film layer is formed of the organic compound and the layer is doped with the acceptor or the donor.

Therefore, according to the present invention, there is provided an organic semiconductor element comprised of an organic structure formed by sequentially laminating an n number of functional organic thin film layers (where n is an integer equal to or greater than 2) consisting of a first through an n-th functional organic thin film layers between an anode and a cathode, characterized in that: a conductive thin film layer in a floating state which includes an organic compound is without exception formed between a k-th functional organic thin film layer (where k is an integer of 1≤k≤(n−1)) and a (k+1)th functional organic thin film layer; and each of the conductive thin film layers contains at least one of an acceptor and a donor for the organic compound.

Also, according to the present invention, there is provided an organic semiconductor element comprised of an organic structure formed by sequentially laminating an n number of functional organic thin film layers (where n is an integer equal to or greater than 2) consisting of a first through an n-th functional organic thin film layers between an anode and a cathode, characterized in that: a conductive thin film layer in a floating state which includes an organic compound is without exception formed between a k-th functional organic thin film layer (where k is an integer of 1≤k≤(n−1)) and a (k+1)th functional organic thin film layer; and each of the conductive thin film layers contains both of an acceptor and a donor for the organic compound.

Note that, when the conductive thin film layer is doped with the acceptor or the donor, the organic compound used in the functional organic thin film layer and the organic compound used in the conductive thin film layer are connected with the same thing (i.e., the organic compound used in the functional organic thin film layer is included into the conductive thin film layer, and the conductive thin film layer is doped with the acceptor or the donor). This enables the element to be manufactured according to a simple process.

Incidentally, in the case where both the acceptor and the donor are included in the conductive thin film layer, it is preferable that: the conductive thin film layer be structured by laminating a first layer formed by adding an acceptor to the organic compound, and a second layer formed by adding a donor to an organic compound that is the same as the organic compound; and the first layer be positioned closer to a cathode side than the second layer.

Also, in such a case, it is preferable that the organic compound used in the functional organic thin film layer and the organic compound used in the conductive thin film layer be connected with the same thing.

Incidentally, in the case where both the acceptor and the donor are included in the conductive thin film layer, it is also preferable that: the conductive thin film layer be structured by laminating a first layer formed by adding an acceptor to a first organic compound, and a second layer formed by adding a donor to a second organic compound that is different from the first organic compound; and the first layer be positioned closer to a cathode side than the second layer.

Also, in such a case, it is preferable that the organic compound used in the functional organic thin film layer and the organic compound used in the first layer be connected with the same thing. Also, it is preferable that the organic compound used in the functional organic thin film layer and the organic compound used in the second layer be connected with the same thing.

The structure of the functional organic thin film layer may be manufactured using a bipolar organic compound, or by combining monopolar organic compounds by laminating a hole transporting layer and an electron transporting layer, for example.

The element structure described above is extremely useful among organic semiconductor elements particularly because in the photoelectronics field it can increase light emission efficiency and light absorption efficiency. That is, by structuring the functional organic thin film layer with the organic compound that exhibits light emission by flowing the electrical current, the organic EL element with high reliability and good efficiency can be created. Further, by structuring the functional organic thin film layer with the organic compound which generates the photoelectric current (i.e., generates the electromotive force) by absorbing light, the organic solar battery with high reliability and good efficiency can be created.

Therefore, the present invention includes everything related to the organic semiconductor element in which the functional organic thin film layer described above has the structure capable of realizing the organic EL element functionality and the organic solar battery functionality.

Note that, particularly in the organic EL element, in the case where the functional organic thin film layer is structured with the bipolar organic compound, the bipolar organic compound preferably includes a high molecular compound having a π-conjugate system. Further, for the conductive thin film layer as well, it is desirable to use a method in which the high molecular compound having an π-conjugate system is used and the layer is doped with the acceptor or the donor to improve the dark conductivity. Alternatively, for the conductive thin film layer, it is also possible to use a conductive high molecular compound with the acceptor or donor added thereto.

Further, in the organic EL element, in the case where, for example, the hole transporting layer made of a hole transporting material, and the electron transporting layer made of an electron transporting material, are laminated to structure the functional organic thin film layer by combining monopolar organic compounds, the conductive thin film layer should also be made using at least one of the hole transporting material and the electron transporting material, and the layers should be doped with the acceptor and donor to increase the dark conductivity. Alternatively, it is also possible to use both the hole transporting material and the electron transporting material. In more specific terms, this refers to a method in which a donor-doped layer of the electron transporting material used in the functional organic thin film layer, and an acceptor-doped layer of the hole transporting material used in the functional organic thin film layer, are laminated upon each other in a structure used as the conductive thin film layer.

The structure of the functional organic thin film layer when used in the organic solar battery is the same as when used in the organic EL element. That is, in the organic solar battery, in the case where the functional organic thin film layer is structured with the bipolar organic compound, the bipolar organic compound preferably includes a high molecular compound having the π-conjugate system. Further, for the conductive thin film layer as well, it is desirable to use a method in which the high molecular compound having the π-conjugate system is used and the layer is doped with the acceptor or the donor to improve the dark conductivity. Alternatively, for the conductive thin film layer, it is also possible to use the conductive high molecular compound with the acceptor or donor added thereto.

Further, in the organic solar battery, in the case where, for example, the layer made of the hole transporting material, and the layer made of the electron transporting material, are laminated to structure the functional organic thin film layer by combining monopolar organic compounds, the conductive thin film layer should also be made using at least one of the hole transporting material and the electron transporting material, and the layers should be doped with the acceptor and donor to increase the dark conductivity. Alternatively, it is also possible to use both the hole transporting material and the electron transporting material. In more specific terms, this refers to a method in which the donor-doped layer of the electron transporting material used in the functional organic thin film layer, and the acceptor-doped layer of the hole transporting material used in the functional organic thin film layer are laminated upon each other in the structure used as the conductive thin film layer.

Note that, if the carrier can be injected into all the conductive thin film layers (ohmic conductive thin film layers) described above, then it is not necessary to reduce sheet resistance in any of them. Accordingly, a conductivity rate of $10^{-10}$ S/m or greater is sufficient.

DETAILED DESCRIPTION OF THE PREFERRED EMBODIMENTS

Hereinafter, detailed explanation is made with respect to embodiments of the present invention, using an organic EL element and an organic solar battery as examples. Note that, with respect to the organic EL element, in order to achieve light emission, it is sufficient if at least one of an anode and a cathode is made transparent. However, in accordance with this embodiment mode, description is made of an element structure in which a transparent anode is formed on a substrate to achieve the light from the anode side. In actuality, the present invention may be applied in a structure in which the cathode is formed onto the substrate to achieve the light from the cathode side, and in a structure in which the light is achieved from an opposite side from the substrate, and in a structure in which the light is achieved from both the electrodes on both sides. In the organic solar battery as well, in order to make the battery absorb light, any one side of the element may be made transparent.

First, in the organic EL element, as means for overcoming the poor reliability deriving from the ultra thin film and also for improving the proportion of light emitted in relation to the electrical current (i.e., the electrical current efficiency), in order to achieve a simple device structure, the organic EL element may be connected serially, for example. This will be explained below.

Figure 1:
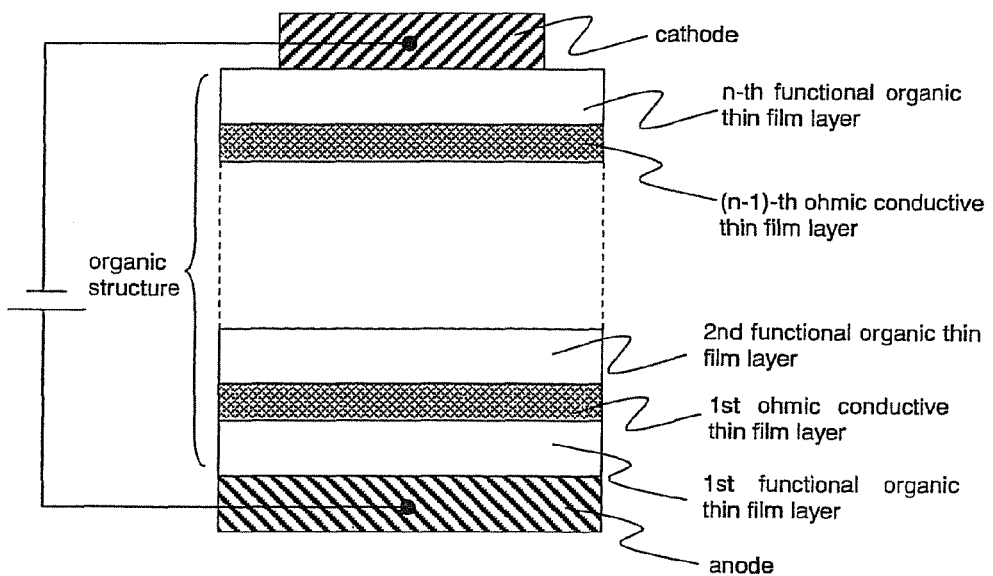
FIG. 1 shows a basic structure of the present invention.
Figure 2A:
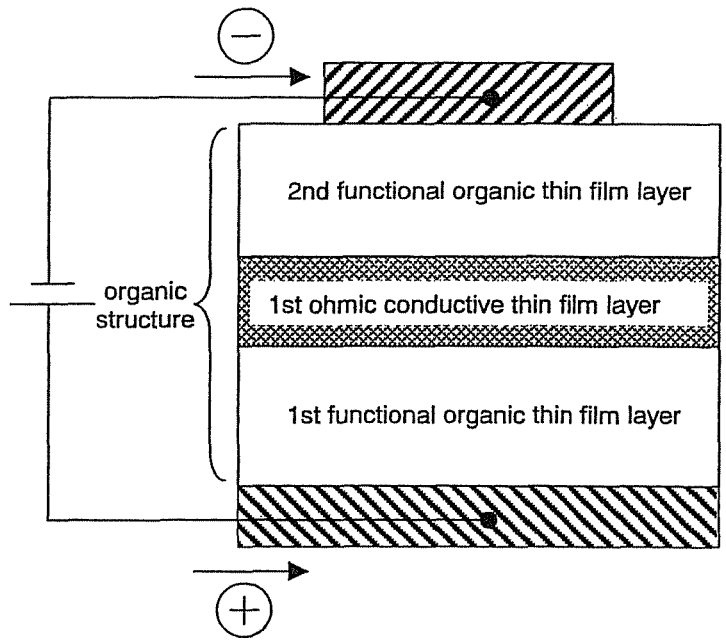
FIGS. 2A and 2B show concepts of the present invention.
Figure 2B:
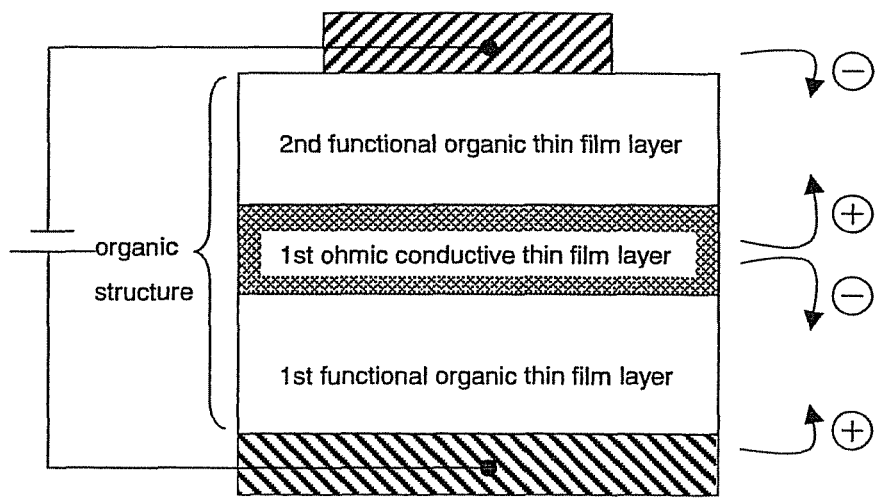
Figure 3A:
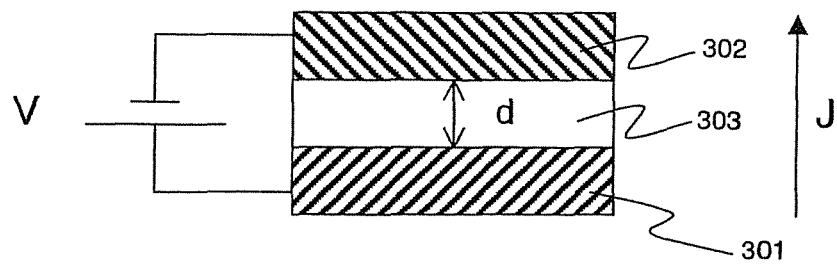
FIGS. 3A to 3C show effects produced by the present invention.
Figure 3B:
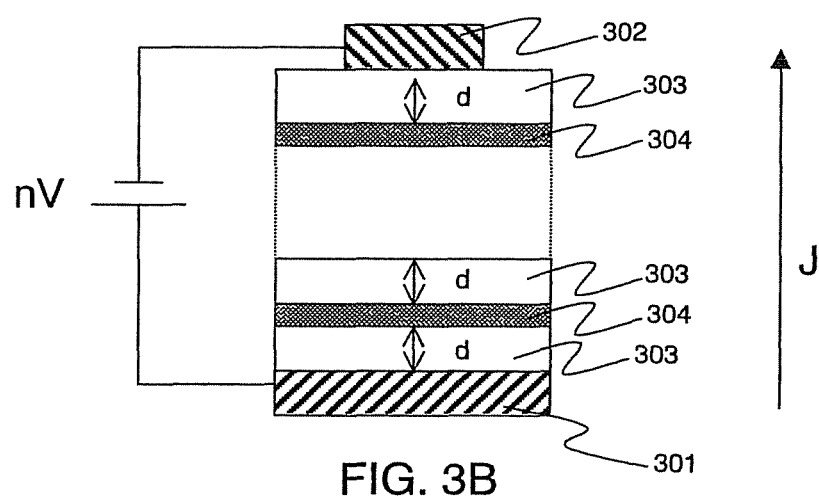
Figure 3C:
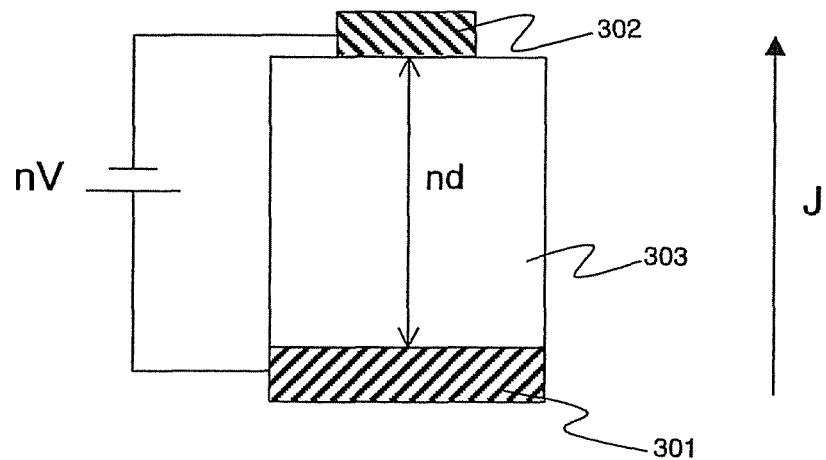
Figure 4A:
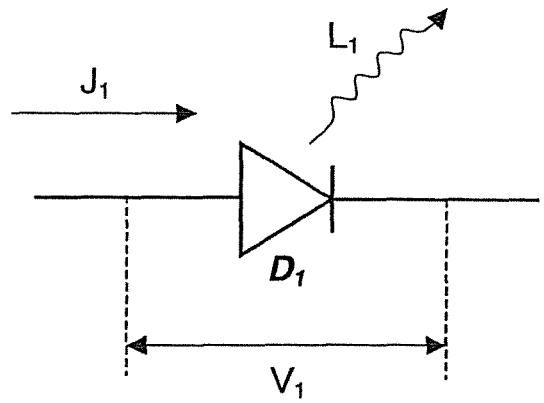
FIGS. 4A and 4B illustrate theory behind improvement in electrical current efficiency.

As shown in, FIG. 4A, assume an organic EL element $D_1$, in which applying a certain electrical voltage $V_1$ causes an electric current with an electric density $J_1$ to flow and light is emitted by a light energy per unit surface area $L_1$ (i.e., photons having certain amounts of energy are emitted, and the light energy is equivalent to the product of that energy multiplied by the number of photons). At this time, a power efficiency $\phi e_1$ (this refers to the light emission energy with respect to the electrical energy (electrical power) that was given, and it means the same thing as an "energy conversion rate") is given in the following formula:

$$\phi e_1 = L_1/(J_1 \cdot V_1) \quad \text{Formula 3}$$

Figure 4B:
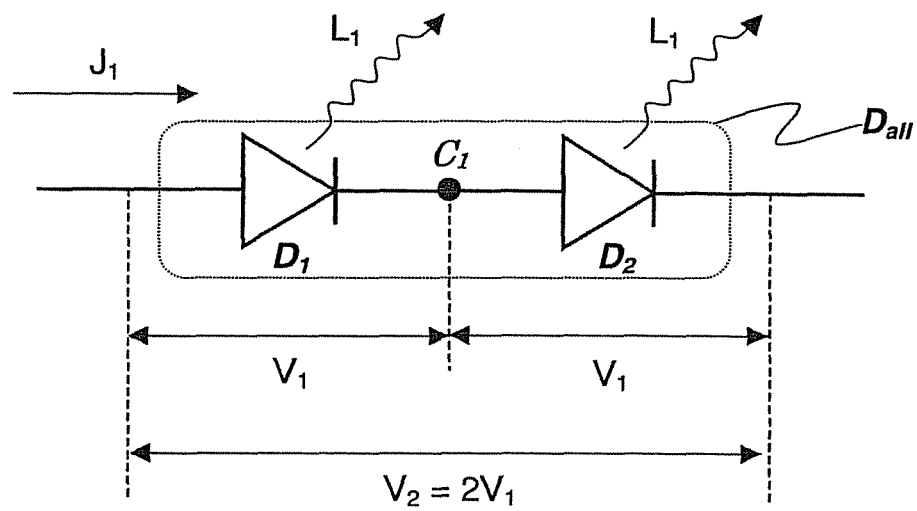

Next, a case will be considered in which an organic EL element $D_2$ that is exactly equivalent to the organic EL element $D_1$ is connected to the organic EL element $D_1$ serially (See FIG. 4B). Note that, a contact point $C_1$ connects the two elements $D_1$ and $D_2$ together ohmically.

Here, the elements as a whole (i.e., element $D_{all}$ having the structure consisting of $D_1$ and $D_2$ connected to each other) are applied with a voltage $V_2$ ($=2V_1$) that is double the voltage that was applied in FIG. 4A. Then, since $D_1$ and $D_2$ are equivalent to each other, the voltage $V_1$ is applied to $D_1$ and to $D_2$, respectively, as shown in FIG. 4B, and the shared electrical current density $J_1$ flows. Therefore, since $D_1$ and $D_2$ each emit light with the light energy $L_1$, double the light energy $2L_1$ can be obtained from the elements as a whole $D_{all}$.

The power efficiency $\phi e_2$ at this time is given in the following formula:

$$\phi e_2 = 2L_1/(J_1 \cdot 2V_1) = L1/(J \cdot V_1) \quad \text{Formula 4}$$

As can be understood by comparing the above-mentioned Formula 3 and the above-mentioned Formula 4, there is no difference between FIG. 4A and FIG. 4B in terms of the power efficiency, and the law of energy conservation in which $V_1$ and $J_1$ are converted to $L_1$ is being obeyed. However, the current efficiency appears to increase twofold, i.e., $L_1/J_1$ is increased to $2L_1/J_1$. This has a significant meaning for the organic EL element. That is, by increasing the organic EL elements connected serially and by applying more voltage in proportion to the number of elements that were increased and maintaining the current density at a fixed level, it becomes possible to increase the electrical current efficiency.

Examining this concept more generally, when n number of the entirely equivalent organic EL elements are ohmically connected, it is possible to achieve n times the brightness level by maintaining the current density at a fixed level and increasing the electrical voltage by n times. This property derives from the proportional relationship between the brightness level and the electrical current density level in the organic EL element.

Of course, even in the case where different organic EL elements are connected serially, the brightness level emitted from each of the organic EL elements will be different. However, by significantly increasing the voltage, it becomes possible to extract more brightness than in the case of a single organic EL element. A conceptual diagram of this is shown in FIG. 5.

Figure 5:
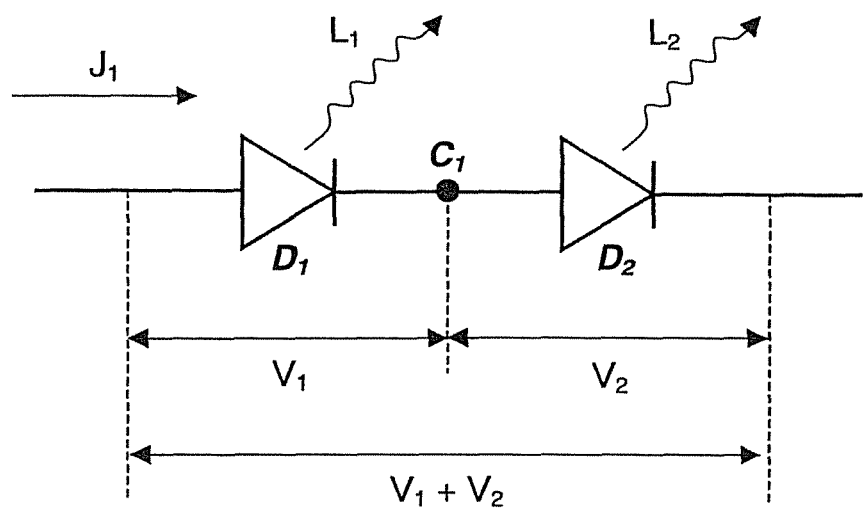
FIG. 5 shows theory behind improvement in the electrical current efficiency.

As shown in FIG. 5, when the different organic EL elements $D_1$ and $D_2$ are connected serially and one of the organic EL elements (either $D_1$ or $D_2$) is applied with a higher voltage $V_1+V_2$ than the necessary voltage (either $V_1$ or $V_2$) to create the electrical current $J_1$, a brightness level $L_1+L_2$ ($>L_1$, $L_2$) can be produced with the current $J_1$.

At this time, by configuring, for example, $D_1$ as a blue light emitting element and $D_2$ as a yellow light emitting element, if color mixing can be performed, then a white color light emission will occur. Therefore, this enables a white color emitting element in which the electrical current efficiency is higher, and therefore the longevity of the element is higher than in the conventional art.

As described above, by ohmically connecting the elements serially, the apparent electrical current efficiency is improved and greater brightness can be obtained with a smaller electrical current. This means that it is possible to make the necessary electrical current for emission of the same level of brightness is kept smaller than in the conventional art. Furthermore, as long as a significant electrical voltage can be applied, it is possible to connect however many organic EL elements as may be needed, and the overall film thickness can be made thick.

Figure 6A:
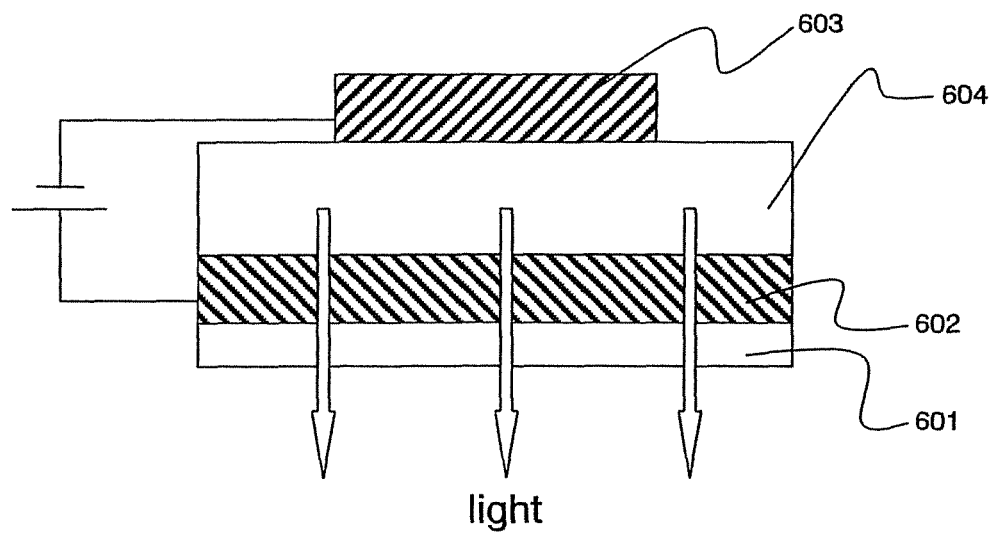
FIGS. 6A and 6B depict conventional organic EL elements.

However, as described above, a problem occurs even in the case where the organic EL elements are simply connected serially. The problem derives from the electrodes for the organic EL elements and from the element structure, which will be explained using FIG. 6. FIG. 6A shows a cross-sectional view of the organic EL element $D_1$ shown in FIG. 4A, and FIG. 6B shows a cross sectional view of all the elements $D_{all}$ shown in FIG. 4B, in a schematic manner.

The basic structure (FIG. 6A) of the normal organic EL element is manufactured by providing a transparent electrode 602 onto a substrate 601 (here, the electrode is an anode, and an ITO or the like is generally used for this), a functional organic thin film layer (hereinafter, referred to as an "organic EL layer") 604 for performing light emission by flowing an electrical current is then formed and a cathode 603 is then provided. With this structure, light can be produced from the transparent electrode (the anode) 602. The cathode 603 may be a cathode which normally employs both a metallic electrode with a low work function, or an electron injecting cathode buffer layer, along with a metallic conductive film (such as aluminum or the like).

Figure 6B:
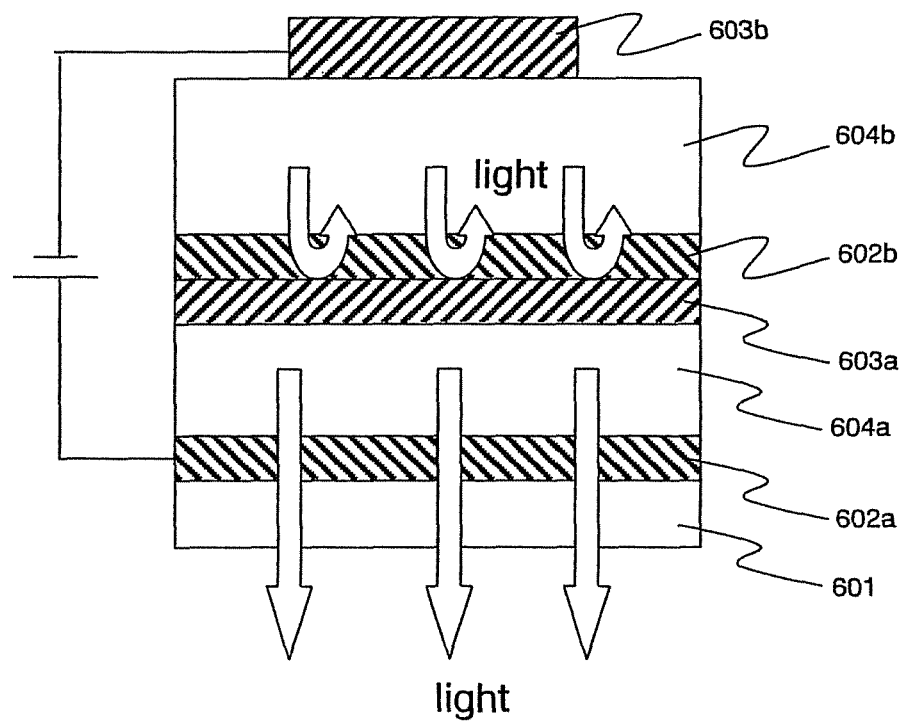

When two organic EL elements having the structure described above are connected simply serially (as shown in FIG. 6B), the structure will include a first transparent electrode (cathode) 602a, a first organic EL layer 604a, a first cathode 603a, a second organic EL layer 604b, a second organic EL layer 604b, and a second cathode 603b, which are laminated in this order from the lower side. Then, the light emitted by the second organic EL layer 604b cannot be transmitted through because the first cathode 603a which is metal, and thus the light cannot be taken out of the element. Therefore, it becomes impossible to do such innovations as mixing the light emission from the upper and the lower organic EL elements to produce the white color light.

For example, a technique using transparent ITO cathodes for both the anode and the cathode has also be reported (Reference 6: G. Parthasarathy, P. E. Burrows, V. Khalfin, V. G. Kozlov, and S. R. Forrest, "A metal-free cathode for organic semiconductor devices", J. Appl. Phys., 72, 2138-2140 (1998)). By using this, the first cathode 603a can be made transparent. Therefore, it becomes possible to bring out the light emitted from the second organic EL layer 604b. However, since the ITOs are mainly formed by sputtering, there is a concern that the organic EL layer 604a will suffer damage. Further, the process also becomes cumbersome because the application of the organic EL layer by deposition and the application of the ITO by sputtering have to be repeated.

Figure 7:
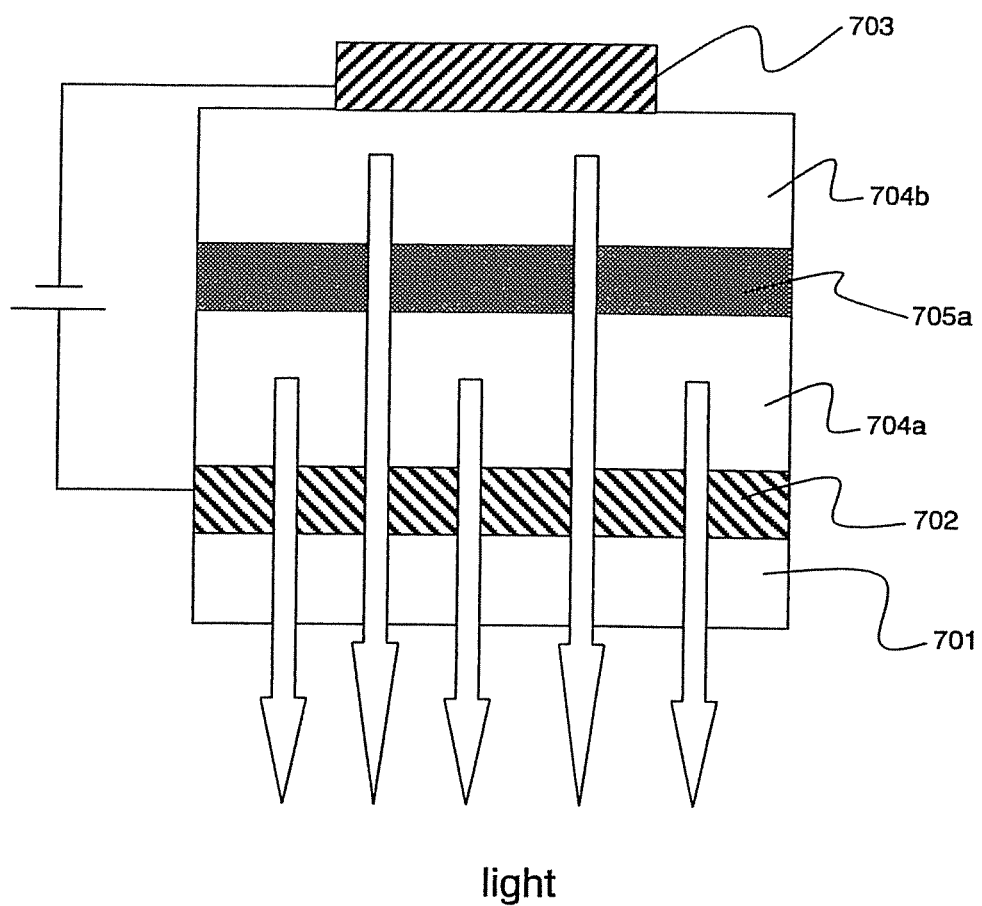
FIG. 7 shows an organic EL element according to the present invention.

In order to overcome this problem, a more desirable embodiment has a structure such as shown in FIG. 7, for example, in which the electrical current efficiency can be improved using a concept similar connecting the elements serially to improve the electrical current efficiency, and also the element transparency issue can be cleared without a problem.

FIG. 7 shows a structure in which a first organic EL layer 704a, a first conductive thin film layer 705a, a second organic EL layer 704b, and a cathode 703 are laminated in this order on a transparent electrode (anode) 702 that is provided to a substrate 701. In this structure, by applying a material in which the acceptor or the donor has been applied to the organic semiconductor, the first semiconductor thin film layer 705a can be connected almost ohmically to the organic EL layer (i.e., the hole carrier and the electron carriers can be injected), and, moreover, the transparency can be maintained almost completely. Therefore, the light emission that is generated with the second organic EL layer 703b can be brought out, and the electrical current efficiency can be doubled simply by doubling the electrical voltage.

Moreover, since the entire process becomes consistent (for example, when using low molecular materials, a dry process such as vacuum deposition can be used, and when using high molecular materials, a wet process such as spin coating can be used), the manufacturing process does not become cumbersome.

Note that, FIG. 7 shows the structure in which two of organic EL layers have been provided. However, as described above, as long as a significant amount of electrical voltage may be applied, the structure may be multi-layered (of course, the conductive thin film layer is inserted between each of the organic EL layers). Therefore, the poor reliability of the organic semiconductor element, which is derived from the ultra thin film structure, can be overcome.

The philosophy described above naturally can also be applied in the organic solar battery, which is said to utilize the opposite mechanism from the organic EL element. This will explained as follows.

It is assumed here that there is an organic solar battery $S_1$ in which a given light energy $L_1$ generates a photoelectric current with an electrical current density $J_1$, thus generating an electromotive force $V_1$. N number of the batteries $S_1$ are ohmically connected serially, and when a light energy $nL_1$ is irradiated there, n times the electromotive force $(=nV_1)$ can be obtained if an equivalent light energy $nL_1/n=L_1$ can be provided to all the n number of solar batteries $S_1$. In short, if all the organic solar batteries that are connected serially can absorb the light, then the electromotive force increases as a product of the number of batteries.

For example, there is a report that discloses improving the electromotive force by connecting two organic solar batteries serially (Reference 7: Masahiro HIRAMOTO, Minoru SUEZAKI, and Masaaki YOKOYAMA, "Effect of Thin Gold Interstitial-layer on the Photovoltaic Properties of Tandem Organic Solar Cell", Chemistry Letters, pp. 327-330, 1990). According to Reference 7, by inserting a gold thin film between the two organic solar batteries (i.e., between a front cell and a back cell) an effect of improving the electromotive force generated by the light irradiation is obtained.

However, Reference 7 also structures the gold thin film to have a thickness of 3 nm or less in order to achieve the transmittivity. In other words, the film is structured as an ultra thin film that is thin enough for light to pass through it, designed so that the light will reach the back cell. Moreover, reproducibility becomes problematic when the thickness of the ultra thin film is on the order of several nm.

Such problems can also be resolved by using the present invention. That is, in the organic solar battery structure such as disclosed in Reference 7, the present invention may be applied at the gold thin film portion. By doing this, the present invention can be used as a single organic solar battery that is thicker and more highly efficient than the conventional art, instead of connecting two elements serially.

The basic concepts and structures of the present invention have been described above using the organic EL element and the organic solar battery as examples. The following describes preferred examples of structures of the conductive thin film layer to be used for the present invention. However, the present invention is not limited to these examples.

First, various metallic thin films can, be used because they are conductive, which is to say they have multiple carriers. Specifically, Au, Al, Pt, Cu, Ni, etc. are examples that can be used. Note that, when these metals are used for the conductive thin film layer, it is preferable that they be formed as ultra thin films thin enough for visible light to pass through (i.e., several nm to several tens of nm).

Further, various metallic oxide thin films can be used, particularly from the viewpoint of visible light transmittivity. Specific examples include ITO, ZnO, $SnO_2$, copper oxide, cobalt oxide, zirconium oxide, titanium oxide, niobium oxide, nickel oxide, neodymium oxide, vanadium oxide, bismuth oxide, beryllium aluminum oxide, boron oxide, magnesium oxide, molybdenum oxide, lanthanum oxide, lithium oxide, ruthenium oxide and BeO. Further, compound semiconductor thin films can also be used, including ZnS, ZnSe, GaN, AlGaN, and CdS.

A particular characteristic of the present invention is that the conductive thin film layer can be structured of an organic compound. For example, there is a technique for mixing a p-type organic semiconductor and an n-type organic semiconductor to form the semiconductor thin film layer.

Typical examples of a p-type organic semiconductor include, in addition to CuPc represented by Chem. 1 below, phthalocyanine bound to the other metals or bound to no metals (represented by Chem. 2 below). The following can be also used as the p-type organic semiconductor: TTF (represented by Chem. 3 below); TTT (represented by Chem. 4 below); methylphenothiazine (represented by Chem. 5 below); N-isopropylcarbazole (represented by Chem. 6 below); and the like. Further, a hole transporting material used for organic EL etc., such as TPD (represented by Chem. 7 below), α-NPD (represented by Chem. 8 below), or CBP (represented by Chem. 9 below) may be also applied thereto.

Chem. 1

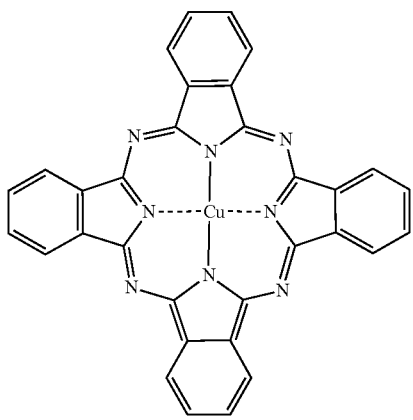

Chem. 2

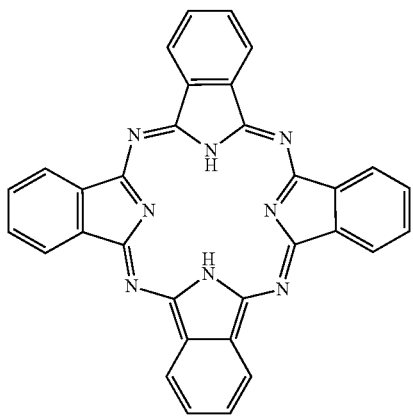

Chem. 3

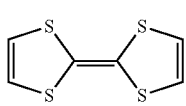

Chem. 4

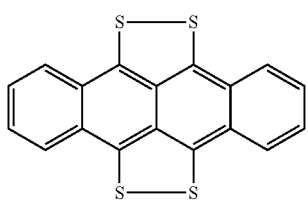

Chem. 5

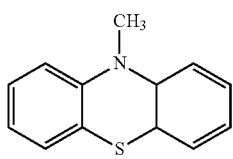

Chem. 6

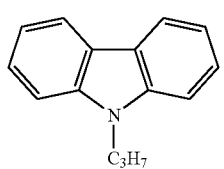

Chem. 7

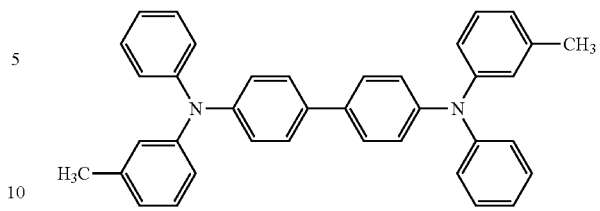

Chem. 8

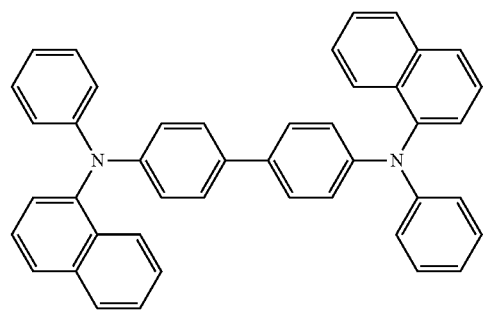

Chem. 9

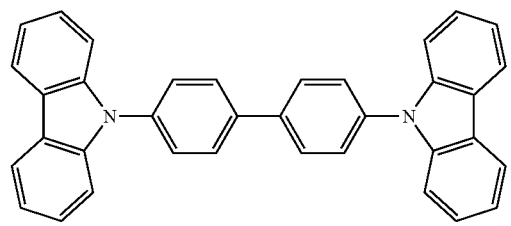

Typical examples of an n-type organic semiconductor include, in addition to $F_{16}$-CuPc represented by Chem. 10 below, 3,4,9,10-perylene tetracarboxylic acid derivatives such as PV (represented by Chem. 11 below), Me-PTC (represented by Chem. 12 below), or PTCDA (represented by Chem. 13 below), naphthalenecarboxylic anhydrides (represented by Chem. 14 below), naphthalenecarboxylic diimide (represented by Chem. 15 below), or the like. The following can be also used as the n-type organic semiconductor: TCNQ (represented by Chem. 16 below); TCE (represented by Chem. 17 below); benzoquinone (represented by Chem. 18 below); 2,6-naphthoquinone (represented by Chem. 19 below); DDQ (represented by Chem. 20 below), p-fluoranil (represented by Chem. 21 below); tetrachlorodiphenoquinone (represented by Chem. 22 below); nickelbisdiphenylglyoxime (represented by Chem. 23 below); and the like. Further, an electron transporting material used for the organic EL etc., such as $Alq_3$ (represented by Chem. 24 below), BCP (represented by Chem. 25 below), or PBD (represented by Chem. 26 below) may be also applied thereto.

[Chem. 10] through [Chem. 25] — chemical structure diagrams.

Chem. 26

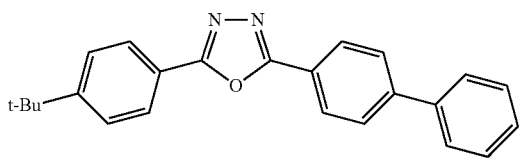

Further, in another preferred technique, an organic compound acceptor (electron acceptor) and an organic compound donor (electron donor) are mixed and a charge-transfer complex is formed to make the conductive thin film layer to create conductivity to serve as the conductive thin film layer. The charge-transfer complex crystallizes easily and is not easy to apply as a film. However, the conductive thin film layer according to the present invention may be formed as a thin layer or in a cluster-shape (as long as the carriers can be injected). Therefore, no significant problems occur.

Representative examples of combinations for the charge-transfer complex include the TTF-TCNQ combination shown in Chem. 27 shown below, and metal/organic acceptors such as K-TCNQ and Cu-TCNQ. Other combinations include [BEDT-TTF]-TCNQ (Chem. 28 below), $(Me)_2P$—$C_{18}TCNQ$ (Chem. 29 below), BIPA-TCNQ (Chem. 30 below), and Q-TCNQ (Chem. 31 below). Note that, these charge-transfer complex thin films can be applied either as deposited films, spin-coated films, LB film, polymer binder dispersed films, or the like.

Chem. 27

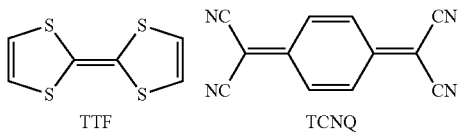

Chem. 28

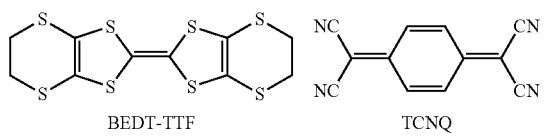

Chem. 29

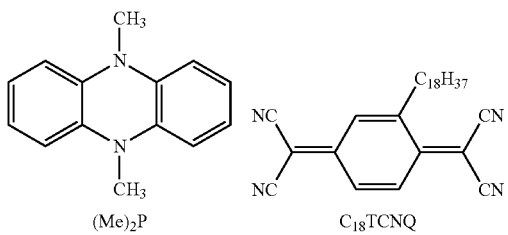

Chem. 30

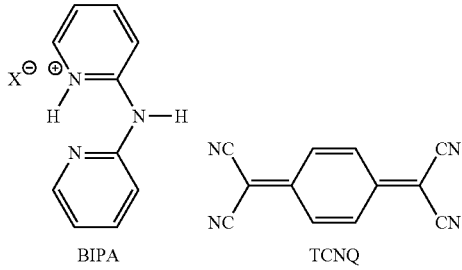

Chem. 31

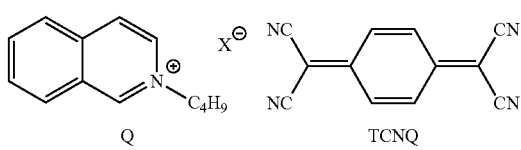

Further, as a structural example of a conductive thin-film layer, a technique of doping an acceptor or a donor into an organic semiconductor to apply a dark conductivity thereto is preferably used. An organic compound having a π-conjugate system represented by a conductive polymer etc. may be used for the organic semiconductor. Examples of the conductive polymer include materials put into practical use, such as poly(ethylenedioxythiophene) (abbreviated to PEDOT), polyaniline, or polypyrrole, and in addition thereto, polyphenylene derivatives, polythiophene derivatives, and poly(paraphenylene vinylene) derivatives.

Also, when the acceptor is doped, it is preferable that a p-type material be used for the organic semiconductor. Examples of the p-type organic semiconductor may include those represented by Chems. 1 to 9 as described above. At this time, Lewis acid (strongly acidic dopant) such as $FeCl_3$ (III), $AlCl_3$, $AlBr_3$, $AsF_6$, or a halogen compound may be used as the acceptor (Lewis acid can function as the acceptor).

Further, in the case where the donor is doped, it is preferable to use an n-type material for the organic semiconductor. Examples of n-type organic semiconductors include the above-mentioned Chems. 10 to 26 and the like. Then, for the donor, alkali metals such as represented by Li, K, Ca, Cs and the like, or a Lewis base such as an alkali earth metal (the Lewis base can function as the donor) may be used.

More preferably, several of the structures described above can be combined to serve as the conductive thin film layer. In other words, for example, on one side or both sides of an inorganic thin film such as the above-mentioned metallic thin film, metallic oxide thin film, or compound semiconductor thin film can be formed with a thin film in which a p-type organic semiconductor is mixed with an n-type organic semiconductor, or the charge-transfer complex thin film, or the doped conductive high molecular thin film, or a p-type organic semiconductor doped with the acceptor, or an n-type organic semiconductor doped with the donor. In such a case, it is effective to use the charge-transfer complex thin film in place of the inorganic thin film.

Further, by layering the n-type organic semiconductor thin film that is doped with the donor and the p-type organic semiconductor thin film that is doped with the acceptor to have these serve as the semiconductor thin film layer, it becomes a functional organic semiconductor layer into which the holes and the electrons can both be injected effectively. Furthermore, a technique is also considered in which the donor doped n-type organic semiconductor thin film and the acceptor doped p-type organic semiconductor thin film or laminated onto one side or both sides of the thin film in which the p-type organic semiconductor thin film and the n-type organic semiconductor thin film are mixed together.

Note that, all the types of the thin film which are given above as structures for the above-mentioned semiconductor thin film layer do not need to be formed in film shapes, but rather they may be also formed as island shapes.

By applying the above-mentioned semiconductor thin film layer in the present invention, it becomes possible to manufacture the organic semiconductor element with high reliability and good yield.

As an example, the organic thin film layer of the present invention can be structured such that light emission is obtained by flowing the electric current, to thereby obtain the organic EL element. Thus, the organic EL element of the present invention is also effective because the efficiency can also be improved.

When used in this way, the structure of the organic thin film layer (i.e., the organic EL layer) may be the organic EL element organic EL layer structure and constitute materials that are generally used. Specifically, many variations are possible such as a laminated structure described in Reference 2 with the hole transporting layer and the electron transporting layer, and a single-layer structure using the high-molecular compound, and the high efficiency element using light emission from the triplet excited state. Further, as described above, the colors from each of the organic EL layers as different emission colors can be mixed as different colors to enable an application as a long-life white color light emission element.

Regarding the anode the organic EL element, if the light is to be made to exit form the anode side, then ITO (indium tin oxide), IZO (indium zinc oxide), and other such transparent conductive inorganic compounds can be often used. An ultra thin film of gold or the like is also possible. If the anode does not have to be transparent (i.e., in the case where the light is made to exit from the cathode side), then a metal/alloy and or a conductive body which does not transmit light but which has a somewhat large work function may be used, such as W, Ti, and TiN.

For the organic EL element cathode, a metal or alloy with a small normal work function such as an alkali metal, alkali earth metal or rare earth metal is used. An alloy including these metallic elements may be used as well. For example, an Mg:Ag alloy, an Al:Li alloy, Ba, Ca, Yb, Er, and the like can be used. Further, in the case where the light is to be made to exit from the cathode side, an ultra thin film made of the metal/alloy may be used.

Further, for example, by using the organic thin film layer according to the present invention as the structure that generates the electromotive force by absorbing the light, the organic solar battery can be obtained. Thus, the organic solar battery of the present invention is effective because it improves efficiency.

When structured in this manner, the structure of the functional organic thin film layer may use the structure and structure materials that are generally used in the functional organic thin film layer of the organic solar battery. A specific example is the laminated structure with the p-type organic semiconductor and the n-type organic semiconductor, such as is described in Reference 3.

EMBODIMENTS

Embodiment 1

Figure 8:
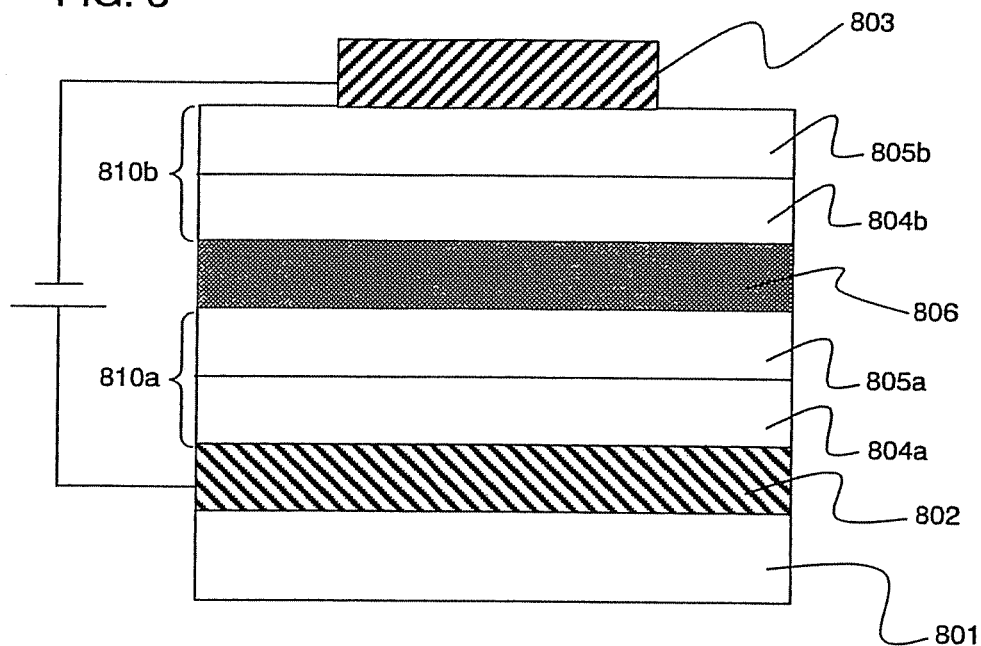
FIG. 8 shows a specific example of an organic EL element according to the present invention.

In accordance with the present embodiment, a specific example will be given of the organic EL element according to the present invention using the charge-transfer complex as the conductive thin film layer. FIG. 8 shows an element structure of the organic EL element.

First, on a glass substrate 801 on which ITO as an anode 802 is deposited into a film with a thickness of about 100 nm, N—N'-bis(3-methylphenyl)-N,N'-diphenyl-benzidine (abbreviated to TPD) as the hole transporting material is deposited by 50 nm to obtain a hole transporting layer 804a. Next, tris(8-quinolinolato)aluminum (abbreviated to Alq) as a light emitting material having an electron transporting property is deposited by 50 nm to obtain an electron-transporting and light emitting layer 805a.

A first organic EL layer 810a is formed in the above manner. Thereafter, TTF and TCNQ are codeposited at a ratio of 1:1 as a conductive thin film layer 806, forming a layer with a thickness of 10 nm.

After that, 50 nm of TPD is deposited as a hole transporting layer 804b, and deposited on top of this is 50 nm of Alq, which serves as an electron transporting layer/light emitting layer 805b. Thus, a second organic EL layer 810b is formed.

Finally, as the cathode 803, Mg and Ag are codeposited at an atomic ratio of 10:1, and the cathode 803 is formed to have a thickness of 150 nm, to thereby obtain the organic EL element of the present invention.

Embodiment 2

Figure 9:
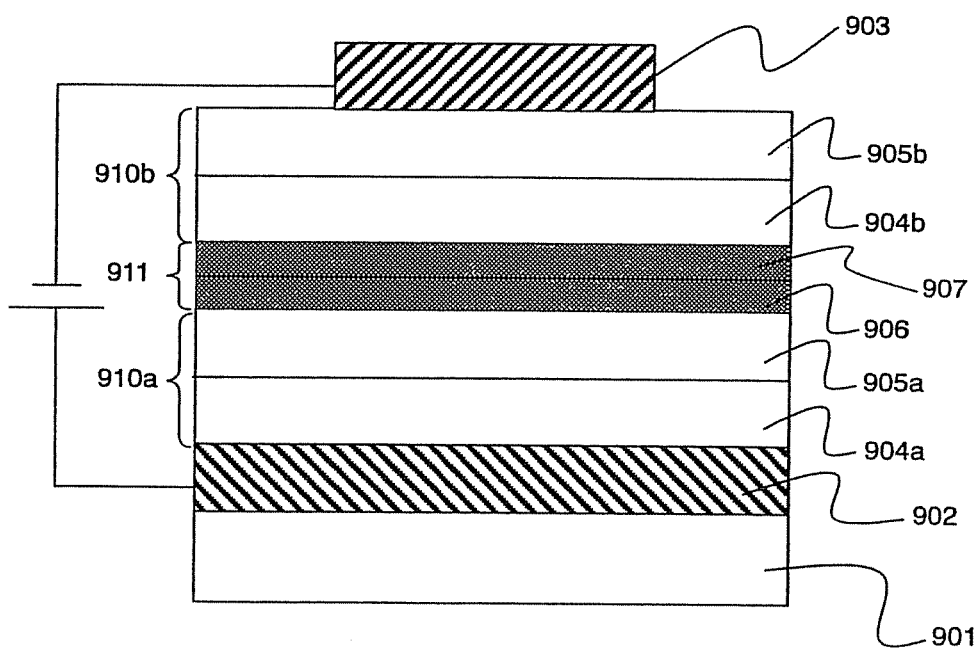
FIG. 9 shows a specific example of an organic EL element according to the present invention.

In accordance with this embodiment, a specific example is shown of an organic EL element of the present invention, in which an organic semiconductor that is the same as used in the organic EL layer is included in the conductive thin film layer, and the acceptor and the donor are doped to make the organic EL element conductive. FIG. 9 shows an example of an element structure of the organic EL element.

First, 50 nm of TPD for serving as the hole transport material is deposited onto a glass substrate 901 which has approximately 100 nm of ITO serving as an anode 902. Next, 50 nm of Alq which serves as the electron transporting light-emission material is deposited, and this serves as an electron transporting layer/light emitting layer 905a.

After a first organic EL layer 910a is formed in this way, 5 nm of a layer 906 is codeposited with the Alq so that the donor TTF constitutes 2 mol %. Then, 5 nm of a layer 907 is codeposited with the TPD so that the acceptor TCNQ constitutes 2 mol %, to serve as a conductive thin film layer 911.

After that, 50 nm of TPD is deposited as a hole transporting layer 904b, and deposited on top of this is 50 nm of Alq, which serves as an electron transporting layer/light emitting layer 905b. Thus, a second organic EL layer 910b is formed.

Finally, as the cathode 903, Mg and Ag are codeposited at an atomic ratio of 10:1, and the cathode 903 is formed to have a thickness of 150 nm, to thereby obtain the organic EL element of the present invention. The element can be manufactured simply by the organic semiconductor in the organic EL layer as the material for structuring the conductive thin film layer, and mixing the donor and acceptor, thus being extremely simple and effective.

Embodiment 3

Figure 10:
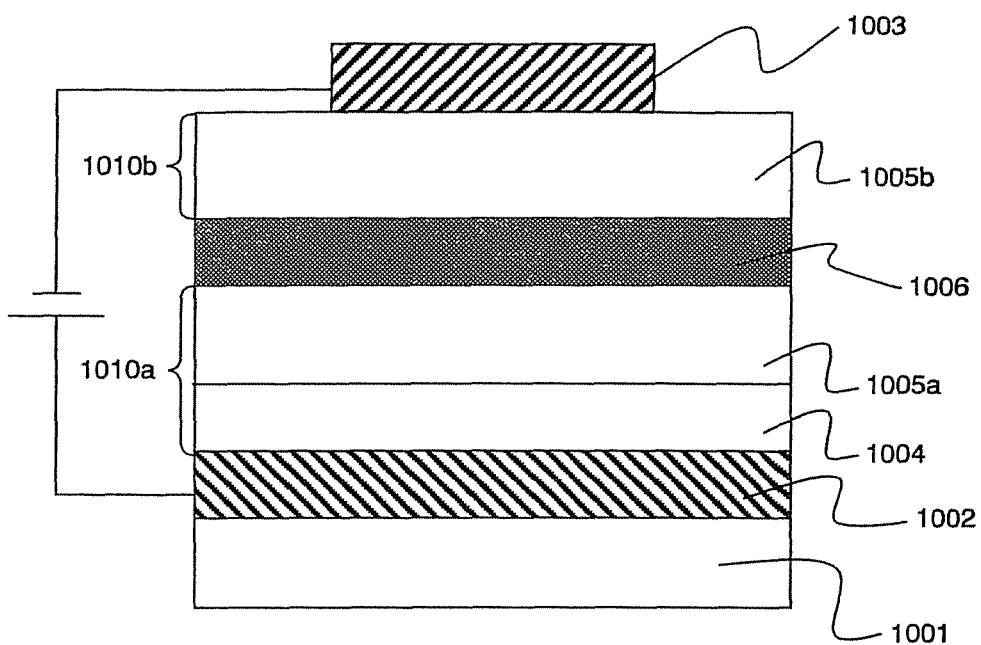
FIG. 10 shows a specific example of an organic EL element according to the present invention.

In accordance with the present embodiment, a specific example is shown of a wet-type organic EL element, in which an electrical light emitting polymer is used for the organic EL layer and the conductive thin film layer is formed of a conductive polymer. FIG. 10 shows an element structure of the organic EL element.

First, onto a glass substrate 1001 on which ITO as an anode 1002 is deposited into a film with a thickness of about 100 nm, a mixed aqueous solution of polyethylene dioxythiophene/polystyrene sulfonic acid (abbreviated to PEDOT/PSS) is applied by spin coating to evaporate moisture, so that a hole injecting layer 1004 is formed with a thickness of 30 nm. Next, poly(2-methoxy-5-(2'-ethyl-hexoxy)-1,4-phenylenevinylene) (abbreviated to MEH-PPV) is deposited into a film with a thickness of 100 nm by spin coating to obtain a light emitting layer 1005a.

A first organic EL layer 1010a is formed in the above manner. Thereafter, a 30 nm film of PEDOT/PSS is applied by spin coating, to serve as a conductive thin film layer 1006.

Then, after that, a 100 nm film of MEH-PPV is applied by spin coating, to serve as a light emitting layer 1005b. Note that, since the conductive thin film layer is made of the same material as the hole injecting layer, this second organic EL layer 1010b does not need a hole injecting layer formed to it. Therefore, in a case where a third and a fourth organic EL layer are to be laminated onto this, a conductive thin film layer PEDOT/PSS and a light-emission layer MEH-PPV can be layered alternately according to extremely simple manipulations.

Finally, 150 nm of Ca is deposited as the cathode. On top of this, 150 nm of Al is deposited as a cap to prevent oxidization of Ca.

Embodiment 4

In accordance with the present invention, a specific example is shown of a organic solar battery of the present invention, in which a mix of the p-type organic semiconductor and the n-type organic semiconductor is applied as the conductive thin film layer.

First, 30 nm of CuPc, which is the p-type organic semiconductor, is deposited onto the glass substrate that has approximately 100 nm of ITO applied onto it as a transparent electrode. Next, 50 nm of PV, which serves as the n-type organic semiconductor, is deposited, and CuPc and PV are used to form a p-n junction in the organic semiconductor. This becomes a first functional organic thin film layer.

After that, CuPc and PV are codeposited at a 1:1 ratio as the conductive thin film layer to have a thickness of 10 nm. Further, 30 nm of CuPc is deposited, and on top of that 50 nm of PV is deposited, whereby creating a second functional organic thin film layer.

Finally, 150 nm of Au is applied as the electrode. The organic solar battery structured as described above is extremely effective because it can realize the present invention simply by ultimately using only two types of organic compounds.

By reducing the present invention to practice, it becomes possible to provide the organic semiconductor element which is highly reliable and has good yield, without having to use the conventional ultra thin film. Further, particularly in the photoelectronic device using the organic semiconductor, the efficiency of the photoelectronic device can be improved.

What is claimed is:

1. A light-emitting device comprising:
an anode;
a first electroluminescent layer over the anode;
a layer over the first electroluminescent layer, the layer consisting of one of molybdenum oxide, vanadium oxide, and niobium oxide;
a second electroluminescent layer over the layer; and
a cathode over the second electroluminescent layer,
wherein each of the first electroluminescent layer and the second electroluminescent layer comprises a hole transporting layer and an electron transporting layer over the hole transporting layer.

2. The light-emitting device according to claim 1,
wherein the layer consists of molybdenum oxide.

3. The light-emitting device according to claim 1,
wherein the layer consists of vanadium oxide.

4. The light-emitting device according to claim 1,
wherein the light-emitting device is capable of emitting white light.

5. The light-emitting device according to claim 1,
wherein the first electroluminescent layer and the second electroluminescent layer emit light with different color so that the light-emitting device is capable of emitting white light.

6. The light-emitting device according to claim 1,
wherein at least one of the first electroluminescent layer and the second electroluminescent layer emits light from a triplet excited state.

7. A light-emitting device comprising:
an anode;
a first electroluminescent layer over the anode;
a first layer over the first electroluminescent layer, the first layer comprising an electron transporting material and a donor to the electron transporting material;
a second layer over the first layer, the second layer consisting of one of molybdenum oxide, vanadium oxide, and niobium oxide;
a second electroluminescent layer over the second layer; and
a cathode over the second electroluminescent layer,
wherein each of the first electroluminescent layer and the second electroluminescent layer comprises a hole transporting layer and an electron transporting layer over the hole transporting layer.

8. The light-emitting device according to claim 7,
wherein the second layer consists of molybdenum oxide.

9. The light-emitting device according to claim 7,
wherein the second layer consists of vanadium oxide.

10. The light-emitting device according to claim 7,
wherein the donor is selected from an alkali metal and an alkali earth metal.

11. The light-emitting device according to claim 7,
wherein the donor is selected from a Lewis base.

12. The light-emitting device according to claim 7,
wherein the light-emitting device is capable of emitting white light.

13. The light-emitting device according to claim 7,
wherein the first electroluminescent layer and the second electroluminescent layer emit light with different color so that the light-emitting device is capable of emitting white light.

14. The light-emitting device according to claim 7,
wherein at least one of the first electroluminescent layer and the second electroluminescent layer emits light from a triplet excited state.

* * * * *